US 6,606,049 B1

(12) United States Patent
Marble

(10) Patent No.: US 6,606,049 B1
(45) Date of Patent: Aug. 12, 2003

(54) ANALOG TO DIGITAL CONVERTERS BASED ON TRANSCONVEYANCE AMPLIFIERS

(75) Inventor: William J. Marble, Provo, UT (US)

(73) Assignee: AMI Semiconductor, Inc., Pocatello, ID (US)

(*) Notice: Subject to any disclaimer, the term of this patent is extended or adjusted under 35 U.S.C. 154(b) by 0 days.

(21) Appl. No.: 10/211,723

(22) Filed: Aug. 2, 2002

(51) Int. Cl.[7] .............................. H03M 1/12; H03F 1/02
(52) U.S. Cl. ........................... 341/155; 330/9; 327/124
(58) Field of Search ............................. 341/155; 330/9, 330/258; 327/554, 124

(56) References Cited

U.S. PATENT DOCUMENTS

| | | | |
|---|---|---|---|
| 3,760,381 A | 9/1973 | Yao .............................. 340/173 |
| 3,949,381 A | * 4/1976 | Dennard et al. ............ 365/205 |
| 4,542,370 A | 9/1985 | Yamada et al. ............. 340/347 |
| 4,912,469 A | 3/1990 | Van De Grift et al. ...... 341/159 |
| 5,051,746 A | 9/1991 | Van De Grift et al. ...... 341/159 |
| 5,175,550 A | 12/1992 | Kattmann et al. .......... 341/159 |
| 5,298,814 A | 3/1994 | Caruso ....................... 307/529 |
| 5,298,902 A | 3/1994 | Kogan ......................... 341/157 |
| 5,621,409 A | 4/1997 | Cotter et al. ................. 341/156 |
| 5,696,511 A | 12/1997 | Matsumoto et al. ........ 341/161 |
| 5,835,048 A | 11/1998 | Bult ............................ 341/159 |
| 5,874,911 A | 2/1999 | Kodama ...................... 341/156 |
| 6,014,098 A | 1/2000 | Bult et al. ................... 341/158 |
| 6,025,794 A | 2/2000 | Musumoto et al. ......... 341/172 |
| 6,100,837 A | 8/2000 | Takeuchi ..................... 341/161 |
| 6,150,851 A | * 11/2000 | Ohmi et al. ................. 327/91 |
| 6,169,510 B1 | 1/2001 | Bult et al. ................... 341/155 |
| 6,222,478 B1 | 4/2001 | Bright ......................... 341/162 |
| 6,249,181 B1 | * 6/2001 | Marble .......................... 330/9 |
| 6,356,148 B1 | * 3/2002 | Marble .......................... 330/9 |
| 6,380,880 B1 | * 4/2002 | Bidermann .................. 341/155 |

OTHER PUBLICATIONS

A 75mW 10b 20MSample/s MCMOS Subranging ADC with 59dB SND IEEE 1999, pp. 1–10.
An 8–MHz CMOS Subranging 8–Bit A/D Converter IEEE 1985, pp 1138–1143.
A Technique for Reducing Differential Non–Linerity Errors in Flash A/D Converters IEEE 1991, pp 170–171.
Ultra Low Power, A/D Converters Using an Enhanced Differential Charge–Transfer Amplifier William J. Marable and Donald T. Conner, American Microsystems, Inc. IEEE Sep. 19–21, 2000, pp 188–191.
Analysis of the Dynamic Behavior of a Charge–transfer Amplifier IEEE 2001, pp 294–298.
CMOS Charge–Transfer Preamplifier for Offset–Fluctuation Cancellation in Low–Power A/D Converters IEEE 1998, pp 762–769.
Analysis of the Behavoir of a dynamic Latch Comparator IEEE 1998, pp 793–804.

* cited by examiner

Primary Examiner—Peguy Jeanpierre
(74) Attorney, Agent, or Firm—Workman, Nydegger & Seeley

(57) ABSTRACT

Transconveyance amplifiers, and more specifically charge transfer amplifiers, are included in analog-to-digital converters. Transconveyance amplifiers are used in averaging and interpolation circuits that facilitate converting an analog signal into a meaningful digital representation of the analog signal. Due to the characteristics of charge transfer amplifiers power dissipation in averaging and interpolation circuits is significantly reduced. Coupling capacitors associated with charge transfer amplifiers are utilized as analog sample and hold circuits for holding an analog signal while fine reference voltages settle. Thus, the need for separate sample and hold circuits is eliminated. A novel timing scheme allows an increased number of clock partitions for fine reference voltages to settle, thus providing for increased operational frequency. Residual charge imbalances at the input terminals of a latch are reduced in a manner that does not affect charge transfer amplifiers that are coupled to the latch during an amplify phase.

44 Claims, 23 Drawing Sheets

ANALOG TO DIGITAL CONVERTERS BASED ON TRANSCONVEYANCE AMPLIFIERS

BACKGROUND OF THE INVENTION

1. The Field of the Invention

The present invention relates to systems and methods for obtaining digital representations of analog electrical signals. More specifically, the present invention relates to systems and methods for performing analog-to-digital conversion using transconveyance (charge-transfer) amplifiers.

2. Background and Relevant Art

There currently exists a strong demand for high-performance semiconductor circuits with reduced power dissipation. This demand is driven by a need for highly mobile and highly functional electronics in a variety of industries such as, for example, medicine, communications, military, and home. One particular type of circuit where this demand for reduced power dissipation exists is in analog-to-digital converters ("ADCs"). ADCs can significantly influence the cost of interfacing to real world signals including, sound, motion, vibration, light intensity, or electrical, and in some cases ADCs can account for up to half of the total power consumed by an integrated circuit. Consequently, power dissipation reduction techniques for ADCs, particularly those techniques that preserve high performance in terms of accuracy, speed, and size, are highly desirable.

There are many circuits and methods conventionally available for performing analog-to-digital conversion. Typically, an analog electrical signal (or a mechanical signal such as a vibration or sound) is sampled, digital values are generated from the samples, and multiple digital values are combined to provide a meaningful digital representation of the analog electrical signal.

Some common types of ADCs include flash converters, subranging converters, pipeline converters, flash-flash converters, delta sigma modulators, and successive approximation converters. Such ADCs often include some number of amplifiers, typically voltage-to-current amplifiers (also frequently referred to as transconductance amplifiers) or voltage-to-voltage amplifiers. The overall performance of these ADCs relies heavily on the properties of these amplifiers, since input and reference voltages feed directly to these amplifiers.

FIG. 1 illustrates a flash ADC 100 that utilizes multiple amplifiers during the analog-to-digital conversion process. The operation of the flash ADC 100 will now be described in order to illustrate the basic principles of analog-to-digital conversion.

Each amplifier in preamplifiers 102 receives two input signals, the analog input 105 and a reference voltage (e.g., one of reference voltages 101). The reference voltages 101 vary incrementally. Preamplifiers 102 generate amplified output signals by amplifying the difference in the analog input and a corresponding reference voltage. Decision circuits 103 receive the amplified output signals and convert the amplified output signals to voltages representing a digital value of a logical "1" or "0." Encoding logic 104 receives the representative digital values and maps the digital values into a meaningful digital representation of the analog input. As shown in FIG. 1, there is at least one amplifier for each digital value generated by flash analog-to-digital converter 100.

Flash ADCs are often desirable because conversion from an analog signal to a digital representation is performed in a single step, or a "flash." However, the resolution (the number of digital output bits generated) of flash converters, such as flash ADC 100 is constrained by the number of amplifiers that are configured to amplify the difference of an analog signal and a reference voltage. That is, flash ADC 100 can only resolve an analog signal to N or less bits if $2^N-1$ amplifiers are configured. For example, to achieve 8 bits of resolution $2^8-1=255$ amplifiers would be required. Therefore, a flash ADC can quickly become impossible to realize as $2^N-1$ amplifiers present a large area requirement and consume a very large amount of power. In many environments, it is desirable to achieve higher levels of resolution than those feasible with a single flash ADC. Other types of ADCs, such as the subranging ADC, overcome some of the constraints of flash ADCs.

Subranging ADCs essentially combine the functionality of two or more flash ADCs to increase output resolution. In an N-bit subranging ADC having two flash ADCs, a first flash ADC would convert an analog signal into m coarse bits. Subsequently, through electrical subranging (i.e., refining the value of the reference voltages), a second flash ADC would convert the analog signal into n fine bits, where m+n equals N, the total resolution. Thus, if the individual flash ADCs each had a resolution of 4 bits, a subranging ADC with two of the flash converters could produce a digital representation with 8 bits of resolution. Yet, the subranging amplifier would require only $(2^4-1)+(2^4-1)=30$ amplifiers.

FIG. 2 illustrates a subranging ADC 200 that utilizes two flash ADCs during the analog-to-digital conversion process. The operation of the subranging ADC 200 will now be described in order to illustrate a conventional subranging ADC technique.

Each amplifier included in coarse flash converter 201 receives the analog input and a coarse reference voltage from reference ladder 202. Reference ladder 202 divides a range of voltages between a minimum and maximum voltage, for example, a range from zero volts to 5 volts, into multiple incrementally increasing coarse reference voltages. For example, using a 0.2 volt increment results in coarse reference values of 0.2 volts, 0.4 volts, 0.6 volts, and so forth. Coarse flash converter 201 uses the analog input and the coarse reference voltages to convert the analog signal into a number of coarse digital values. The coarse digital values are stored in the hold circuit 206 until fine flash converter 204 generates the fine digital bits in a manner that is now to be described.

Reference ladder 202 also divides the range of voltages into multiple incrementally increasing fine reference voltages that more closely approximate the actual value of the analog input signal. This closer approximation is generated using the coarse digital bits as an input and thus the increment for fine reference values is decreased when compared to that used for coarse reference values. However, the fine reference voltages take some amount of time to approach or "settle to" their final values since generation of the fine reference voltages is delayed by at least the amount of time taken to generate the coarse digital bits. As such, the analog input must be held at fine flash converter 204 while these fine reference voltages settle. In FIG. 2, analog sample and hold circuit 207 performs this hold function. Typically, sample and hold circuit 207 is a global sample and hold circuit that may be accessed by any of the components included in subranging ADC 200. The circuitry required to implement a sample and hold circuit consumes space, increasing the overall size of subranging ADC 200, and consumes power, increasing the overall power dissipation of subranging ADC 200.

After the fine reference voltages settle, fine reference multiplexer 203 receives the fine reference voltages and the coarse digital values. The coarse digital values are then used to select which of the fine reference voltages best approximate the analog signal at the sampling time. Fine reference multiplexer 203 then outputs those selected fine reference voltages to the fine flash converter 204.

Each amplifier of fine flash converter 204 receives the analog input, which was being held in analog sample and hold circuit 207, and a subranged fine reference voltage. Fine flash converter 204 uses the analog input and the subranged fine reference voltages to convert the analog signal into a number of fine digital values. Encoding logic 205 combines the coarse digital values and fine digital values into a meaningful digital representation of the analog input.

Subranging ADCs are advantageous due to the increased output resolutions that are obtained as compared to using one flash ADC alone for a given number of amplifier sections. However, the combination of multiple flash ADCs also introduces certain drawbacks. As described above, the coarse digital values are generated before the fine reference voltages have time to settle. However, the coarse digital values are required for selecting a subranged portion of the fine reference voltages. Thus, as described, the analog input must be held for some time, for example, in analog sample and hold circuit 207, prior to the calculation of the fine reference voltages. The use of sample and hold circuits increases the manufacturing resources needed to produce ADCs and may introduce errors into the conversion process.

Subranging ADCs are also limited in operational frequency for at least two reasons. One reason is that amplifier arrays require an appropriate amount of time to properly amplify input signals. Conventional timing schemes require two clock partitions (roughly one clock cycle) for proper amplification. Thus, if other components in an ADC perform functions in a single clock partition, the amplification of input signals may be viewed as a bottleneck in the conversion process.

Operational frequency is also limited due to the fine reference voltages requiring an appropriate amount of time to adequately "settle" (approach their final potentials) before they are useful to a fine flash converter. A fine flash converter attempting to convert an analog signal into fine digital values before the fine reference voltages have adequately settled increases errors in the conversion process. Conventional timing schemes utilized by subranging converters allow up to two clock partitions for fine reference voltages to settle. Thus, the operational frequency of a subranging converter is sufficiently low such that one full clock cycle is long enough for the fine reference voltages to adequately settle. For example, a subranging converter where 0.001 seconds is an appropriate amount of time for fine reference voltages to adequately settle would be limited to a maximum possible operational frequency of 1 kHz.

Since amplifiers are widely used in flash and subranging ADCs, the performance characteristics of such amplifiers significantly affect the operation of the ADC. There are at least two problems associated with the use of conventional amplifiers in flash and subranging ADCs, and in any ADC that uses amplifiers.

One such problem is cell mismatch, which occurs when each amplifier in the array of amplifiers (such as preamplifiers 102) has different offset voltages. Offset voltage is a voltage difference that must be applied between the input terminals of an amplifier to result in a differential output voltage of zero volts. Even if the design of each amplifier in an amplifier array was identical, inevitable differences in fabrication and manufacturing will typically cause the offset voltage of each operational amplifier to differ somewhat. When an analog input signal and a reference voltage are applied to the input terminals of an array of amplifiers, some amplification error will result due to disparate offset voltages. This amplification error may propagate into other portions of a circuit, such as decision circuits 103, and may affect the accuracy of digital representations of analog signals obtained from analog-to-digital converters.

One technique that reduces the effects of cell mismatch in arrays of amplifiers is "averaging." In circuits that use averaging, resistors or capacitors are connected between corresponding output terminals of adjacent amplifiers. Averaging acts to reduce the effects of cell mismatch by averaging offset voltages over neighboring cells thus increasing accuracy in digital conversion. Implementations of averaging circuits are proposed in U.S. Pat. No. 5,835,048 issued to Klaas Bult for "Analog-to-Digital Converter With Improved Cell Mismatch Compensation," U.S. Pat. No. 6,014,098 issued to Klaas Bult and Aaron W. Buchwald for "Analog-to-Digital Converter," and U.S. Pat. No. 6,169,510 issued to Klaas Bult for Analog-to-Digital Converter."

FIG. 3 illustrates generally an example of an averaging circuit 300 for an array of differential output amplifiers 302A through 302C. Intermediate capacitors 301 couple each of the output terminals of each amplifier to corresponding output terminals of adjacent amplifiers. The capacitors of intermediate capacitors 301 cause adjacent output terminals, for example those of amplifier 302A and 302B, to be pulled towards the same voltage, thus tending to average any voltage errors.

As previously mentioned, ADCs in the related art typically use voltage-to-voltage or voltage-to-current amplifiers. One typical problem in semiconductor circuits using these types of amplifiers, and thus also common in ADCs employing arrays of these types of amplifiers, is power dissipation. When the number of components in an ADC is increased, the power required to operate ADCs also increases, thereby limiting the scope of applications in which the ADC may operate. Likewise, as power dissipation increases, additional heat is generated, thereby changing the anticipated behavior of the ADC.

One technique that reduces power dissipation in ADCs is interpolation. In circuits utilizing interpolation, the output values of first and second adjacent amplifiers are used to estimate a third "interpolated" output that is between the first and second output values. Accordingly, the third interpolated output is generated using the first and second amplifiers, but does not use a third amplifier. The interpolated output is then electrically useful for subsequent signal processing, such as an input to a decision circuit, as if there was a third amplifier in between the first and second amplifiers.

Accordingly, the power dissipation is reduced by the amount of power dissipation that would have been present in the third amplifier. In a larger amplifier array, interpolation reduces power dissipation by eliminating the need for a significant number of amplifiers in the array. Moreover, interpolation helps reduce size. Implementations of interpolation circuits are proposed in U.S. Pat. No. 4,912,469 and U.S. Pat. No. 5,051,746 both issued to Robert E. J. van de Grift and Martien van der Veen for "Interpolation Circuit For Use In A/D Converter."

FIG. 4 illustrates generally an example of an interpolation circuit 400 for an array of differential output amplifiers. Interpolated amplifier outputs 404 serve as inputs for decision circuit 403B without being directly output from any amplifier. Interpolated amplifier outputs 404 are coupled by intermediate capacitors 401 to the output terminals of amplifiers 402A and 402C. Due to the capacitive coupling effects of intermediate capacitors 401, the values of interpolated amplifier outputs 404 are pulled to a value between the outputs of amplifier 402A and 402C.

Thus, in the related art, interpolation can be used to reduce the number of voltage-to-voltage or voltage-to-current amplifiers needed for analog-to-digital conversion. However, as shown in FIG. 2, even if the number of amplifiers in an ADC is reduced, a significant number of amplifiers would still be needed to perform analog-to-digital conversion. Further, as the number of amplifiers in an ADC is reduced, the accuracy of the ADC may be affected. Thus, there would need to be some minimum threshold of amplifiers to perform analog-to-digital conversion within a specified level of accuracy. As such, at this minimum threshold of amplifiers, further reduction in power dissipation would need to result from improved performance characteristics (i.e. reduced power dissipation) of the components such as, for example, the amplifiers included in an ADC.

Additionally, conventional averaging and interpolation techniques tend to "pull" the outputs of amplifiers on the ends of a sequential amplifier array (the first and last amplifiers) causing distortion. Distortion results at the end amplifiers because these amplifiers are coupled to intermediate capacitors in only one direction. FIG. 5 illustrates a graph 500 that shows the effects of averaging on the outputs of amplifiers at the end of a sequential amplifier array. As shown in FIG. 5, the actual output pulls away from the ideal output at both ends of the conversion range. This pulling away is indicative of distortion. The '048 patent implements a method using voltage-to-voltage amplifiers to reduce distortion.

For some rudimentary applications, ADC's using charge-transfer amplifiers have been implemented. For example, U.S. Pat. No. 6,150,851 issued to Ohmi et al. for "Charge transfer amplifier circuit, voltage comparator, and sense amplifier" describes an implementation of a 1-bit comparator. The comparator of the '851 patent includes a charge-transfer amplifier and a latch, the combination of which is used for separating an input voltage into a logical 1 or 0. Subsequently, some increases in resolution have occurred. However, due to the general mode of operation of charge-transfer amplifiers being markedly different from any other class of amplifier, no charge-transfer amplifier based flash ADC with over 4-bits has been implemented. The operation of charge-transfer amplifiers provides significant design related challenges to such an implementation.

Further, even in current implementations, including the 1-bit charge-transfer amplifier based comparator described in the '851 patent, there is at least one significant disadvantage. Charge-transfer amplifiers typically operate cyclically with each cycle having three phases; (a) a reset phase, (b) a precharge phase, and (c) an amplify phase. At the beginning of the precharge phase charge imbalances occur at the output terminals. Ideally these charge imbalances should be zeroed out before the amplify phase begins. In environments were increased operational frequency is desirable, for example, analog-to-digital converters, there is often insufficient time for these charge imbalances to be zeroed out. Thus, a charge imbalance from a precharge phase may persist into a subsequent amplify phase. Because charge transfer amplifiers are sensitive to charge imbalances, this results in a stored offset voltage. The stored offset voltage can affect the resulting digital output from a latch and increases the chance that incorrect digital logical values are asserted at the outputs of the latch.

It would, therefore, represent an advancement in the art to create charge-transfer amplifier based ADC's that zero out charge imbalances on latch input terminals. It would represent a further advancement in the art to create ADCs that provide accurate digital output at increased operating frequencies. It would represent yet a further advancement in the art to create ADCs that have reduced power dissipation.

BRIEF SUMMARY OF THE INVENTION

The foregoing problems in the prior state of the art have been successfully overcome by the inventive concepts of the present invention. The present invention includes at least four inventive concepts. A first inventive concept is directed to averaging and interpolation circuits that use transconveyance amplifiers. A second inventive concept is directed to sample and hold circuits where coupling capacitors of a charge transfer amplifier are used to sample and hold an analog signal. A third inventive concept is directed to timing schemes for allowing fine reference voltages to settle. A fourth inventive concept is directed to a comparator where residual charge imbalances at the input terminals of a latch may be significantly reduced.

The first inventive concept is directed to the use of transconveyance amplifiers in averaging and interpolation circuits contained in analog-to-digital converters. Transconveyance amplifiers are voltage-to-charge amplifiers, that is transconveyance amplifiers receive voltage as input and convey a specific amount of charge as output. Due to the electrical characteristics of transconveyance amplifiers, power dissipation in averaging and interpolation circuits using transconveyance amplifiers may be significantly reduced. In some averaging and interpolation circuits the outputs of adjacent transconveyance amplifiers are cross-coupled to reduce distortion.

The second inventive concept is directed to sample and hold circuits where coupling capacitors of a charge transfer amplifier are used to sample and hold an analog signal. Since most charge transfer amplifiers already use coupling capacitors to aid dynamic biasing, no additional components are required to gain sample and hold functionality in an analog-to-digital converter. A novel timing scheme controls when a number of switches open and close so as to hold an input voltage at a terminal of a coupling capacitor of a charge transfer amplifier used in an analog-to-digital converter.

The third inventive concept is directed to timing schemes for allowing fine reference voltages to settle in a subranging analog-to-digital converter. In a subranging analog-to-digital converter, charge transfer amplifiers in a coarse bank of charge transfer amplifiers operate in the amplify phase for one clock partition. Due to the electrical properties of charge transfer amplifiers, charge transfer amplifiers do not suffer substantially from degraded performance through large offset voltages when the length of time for the amplify phase is reduced. Further, the number of clock partitions for allowing fine reference voltages to settle is increased to at least three clock partitions, providing at least a 50% increase in operational frequency over existing timing techniques.

A fourth inventive concept is directed to a comparator where residual charge imbalances at the input terminals of a latch may be significantly reduced. Latch reset switches are controlled by a novel timing scheme to cause charge imbalances to be significantly reduced prior to each amplify phase of a charge transfer amplifier. During the precharge phase of the charge transfer amplifier the precharge voltage is asserted at the input terminals of the latch, while the latch itself remains isolated from the charge transfer amplifier. This allows the latch to recover in a reduced amount of time without any residual charge being transfer to the charge transfer amplifier.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The invention is described below by using diagrams to illustrate either the structure or processing of embodiments used to implement the circuits and methods of the present invention. Using the diagrams in this manner to present the invention should not be construed as limiting of the scope of the invention. Specific embodiments are described below in order to facilitate an understanding of the general principles of the present invention. Various modifications and variations will be apparent to one of ordinary skill in the art after having reviewed this disclosure.

This description contains at least four inventive concepts. A first inventive concept is averaging and interpolation circuits that use transconveyance (voltage-to-charge) amplifiers. A second inventive concept is sample and hold circuits that use the inherent coupling capacitors of a charge transfer amplifier to sample and hold an analog signal. A third inventive concept is timing schemes for charge transfer amplifiers that, when utilized, may increase the operational frequency of a subranging analog-to-digital converter. A fourth inventive concept is comparators that significantly reduce errors due to residual charge imbalances at the input terminals of a latch.

In this description and in the following claims, a "transconveyance amplifier" is defined as any amplifier that receives voltage as an input and produces charge as an output. A transconveyance amplifier is also referred to as a "transcapacitance amplifier" or a "charge-transfer-amplifier" (hereinafter referred to as a "CTA"). Transconveyance amplifiers, transcapacitance amplifiers, and charge-transfer amplifiers can be classified as voltage-to-charge amplifiers.

Transconveyance amplifiers operate generally to convey a proportional amount of charge in response to an input voltage. A transconveyance amplifier conveys charge according to the equation $\Delta Q = g_c * \Delta V_{IN}$, where $\Delta Q$ represents an quantity of conveyed charge, $\Delta V_{IN}$ represents an input voltage, and $g_c$ represents the "transconveyance" of the transconveyance amplifier. Transconveyance can also be called "transcapacitance" as $g_c$ has units of Farads and can relate to the value of an actual circuit capacitor. Given a load capacitance $C_L$, voltage gain for a transconveyance amplifier can be calculated according to the equation $(\Delta V_{IN}/\Delta V_{OUT})=(g_c/C_L)$, where $\Delta V_{OUT}$ represents an output voltage. The symbol "$g_c$" may be used as a descriptive label to indicate transconveyance amplifiers throughout the Figures of this application.

Figure 23:
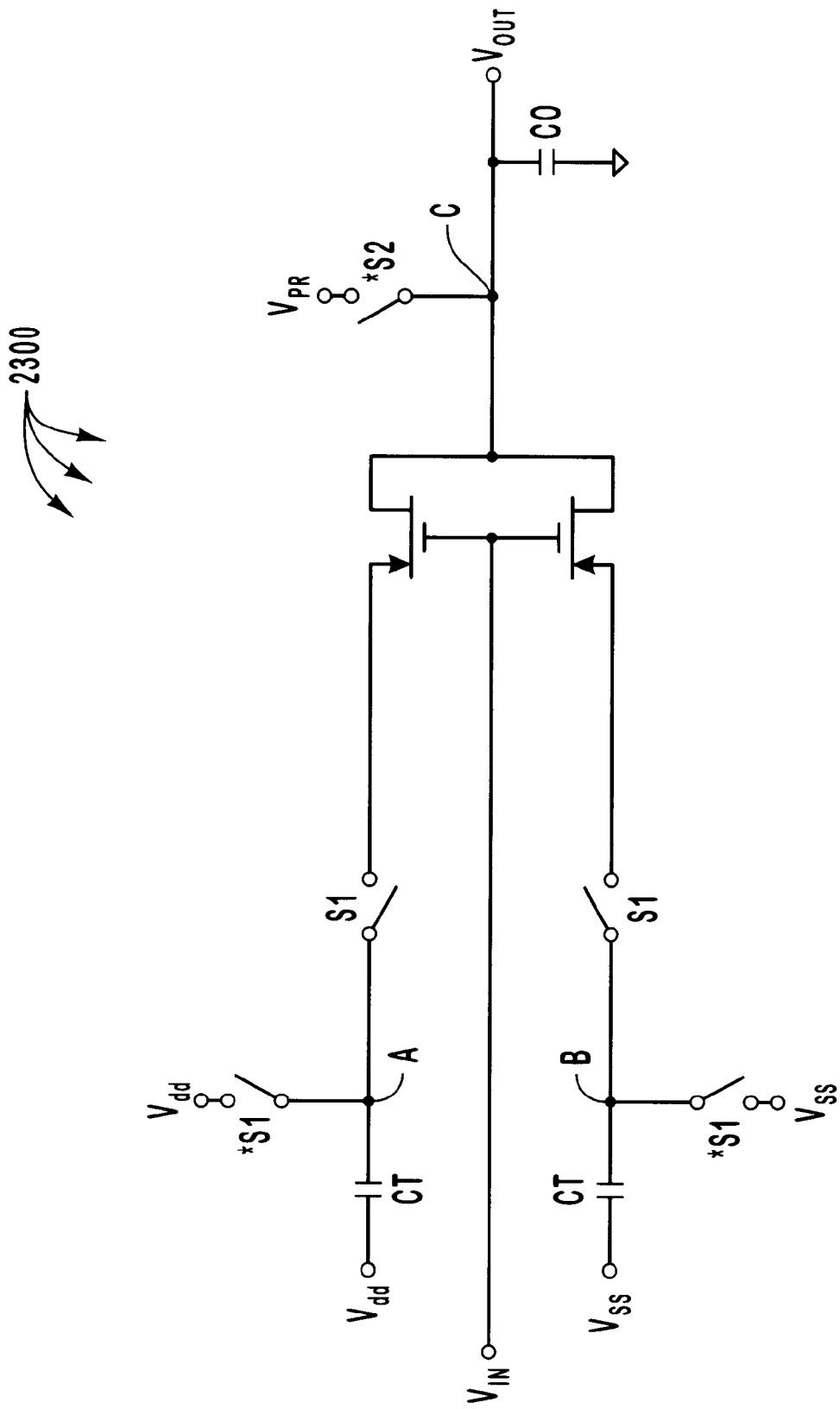
FIG. 23 is a circuit diagram of a single-ended charge transfer amplifier.
Figure 24:
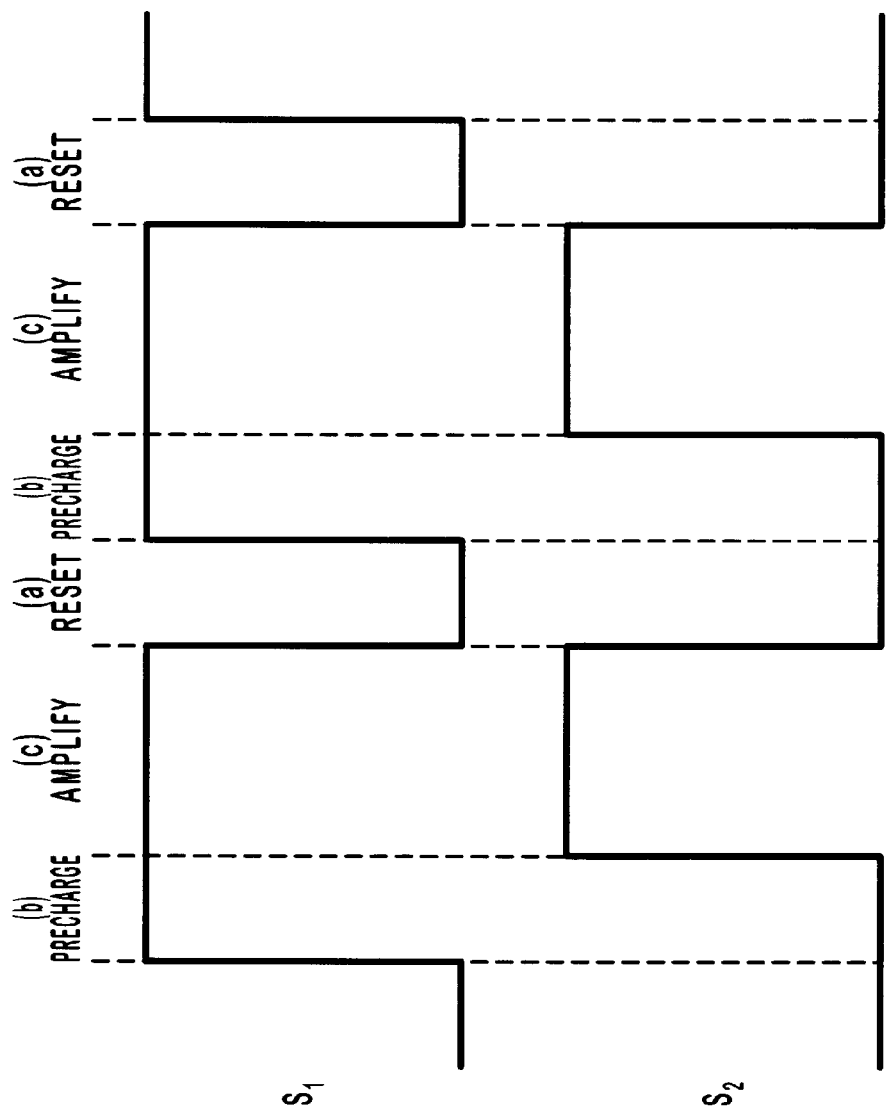
FIG. 24 is a timing diagram of several waveforms used to operate switches S1 and S2 in order to properly operate the single-ended charge transfer amplifier of FIG. 23.

The first inventive concept of averaging and interpolation circuits that use voltage-to-charge amplifiers will now be described. FIG. 23 illustrates an example of a single ended CTA as are well known in the art. CTA 2300 operates cyclically with each cycle having three phases; (a) a reset phase, (b) a precharge phase, and (c) an amplify phase. FIG. 24 illustrates two timing signals used to operate corresponding switches in order to implement the phases of CTA 2300. In the reset phase, the signal $S_1$ is low indicating that the switches *S1 are closed and the switches S1 are open and the signal $S_2$ is low indicating that the switch *S2 is closed. This causes the capacitors CT to discharge, removing any charge build up in preparation for the next amplify phase. In the precharge phase, signal $S_1$ is high indicating that the switches *S1 are open and the switches S1 are closed and the signal $S_2$ is low indicating that the switch *S2 is open. This causes both transistors to be on the verge of conducting in preparation for the amplify phase. In the amplify phase, signal $S_1$ is high indicating that the switches *S1 are open and the switches S1 are closed and the signal $S_2$ is high indicating that the switch *S2 is open. This causes CTA 2300 to amplify such that $V_{OUT}$ equals approximately—$(\Delta V_{IN}) \times (CT/CO)$.

While FIG. 23 illustrates a single ended CTA, embodiments of the present invention may also be practiced with differential mode CTAs as are well known in the art. A further description of differential mode charge transfer amplifiers, as well as charge transfer amplifiers in general, may be found in U.S. Pat. No. 6,249,181 issued to William J. Marble for "Differential-Mode Charge Transfer Amplifier." It should be understood that CTAs are only examples of voltage-to-charge amplifies and that the present invention may be practiced with other transconveyance or transcapacitance amplifiers in addition to known CTAs.

Because charge rather than current is managed by voltage-to-charge amplifiers to produce voltage gain, power dissipation can be significantly reduced. For example, in a 10-bit subranging analog-to-digital converter ("ADC") utilizing CTA's, power dissipation may be reduced by as much as 60% over ADCs utilizing other types of amplifiers. Further, voltage-to-charge amplifiers are robust over a wide range of operating conditions and tolerant to large fluctuations in device parameters, such as, for example, threshold voltage and transconductance.

In the Figures of this description, vertical sequences of three periods (vertical ellipses) may be illustrated in circuit diagrams. It should be understood that a vertical sequence of three periods indicates that other circuit components similar to those expressly illustrated in a circuit diagram may also be included in the circuit diagram. However, to simplify the description of the present invention, these components may not be expressly illustrated.

Figure 1:
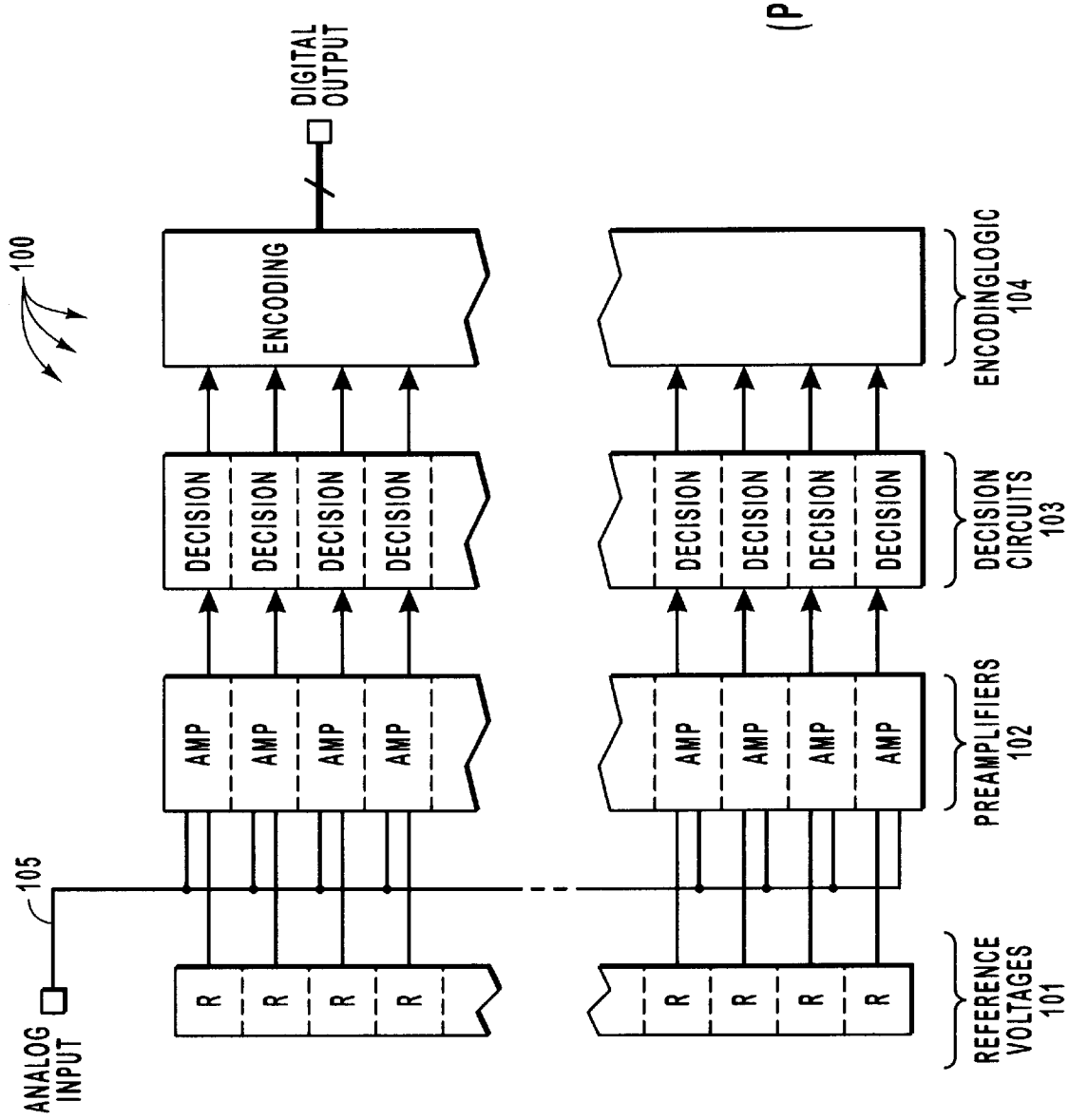
FIG. 1 is block diagram of a conventional flash analog-to-digital converter.
Figure 2:
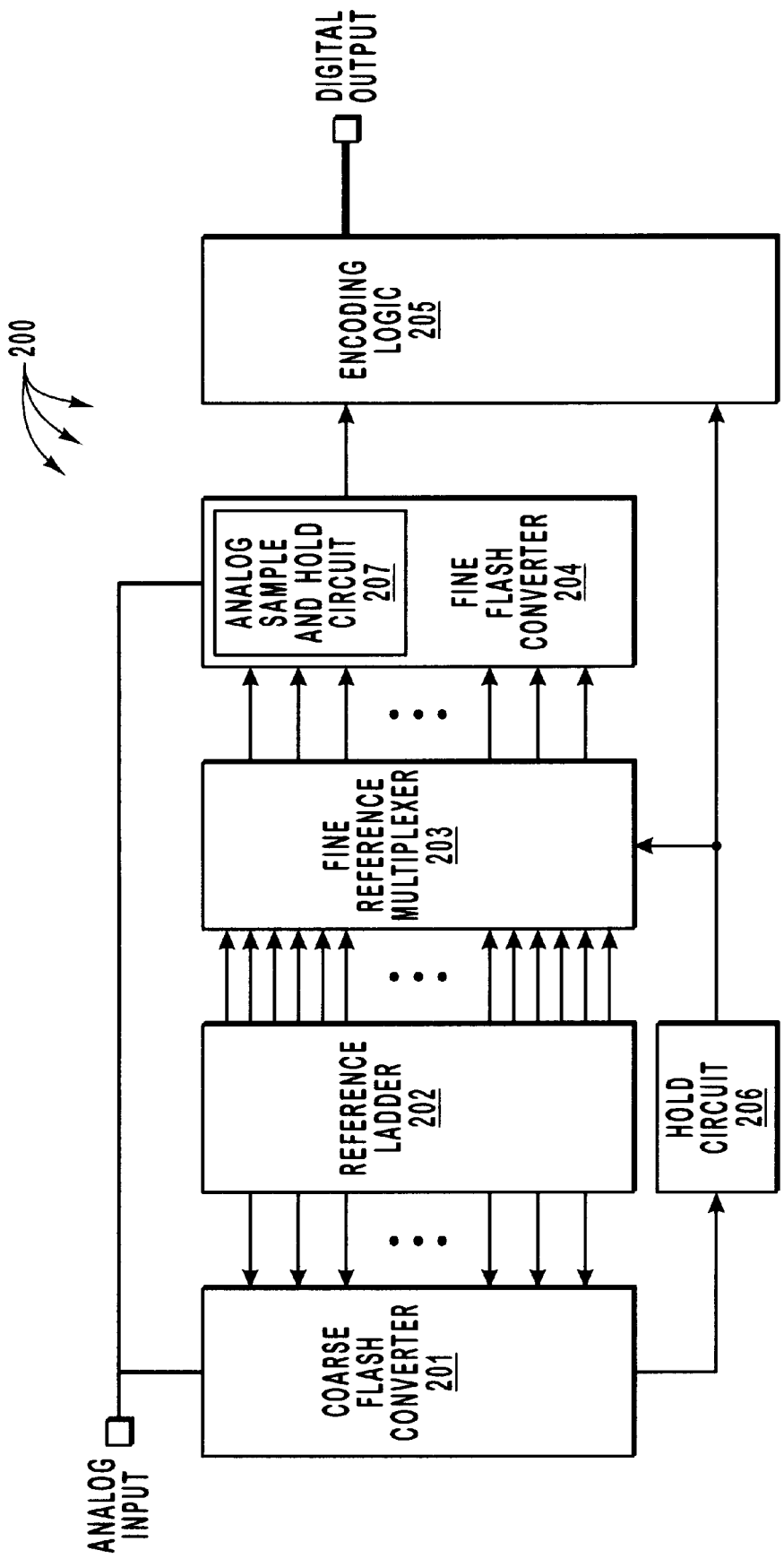
FIG. 2 is a block diagram of a conventional subranging analog-to-digital converter.
Figure 3:
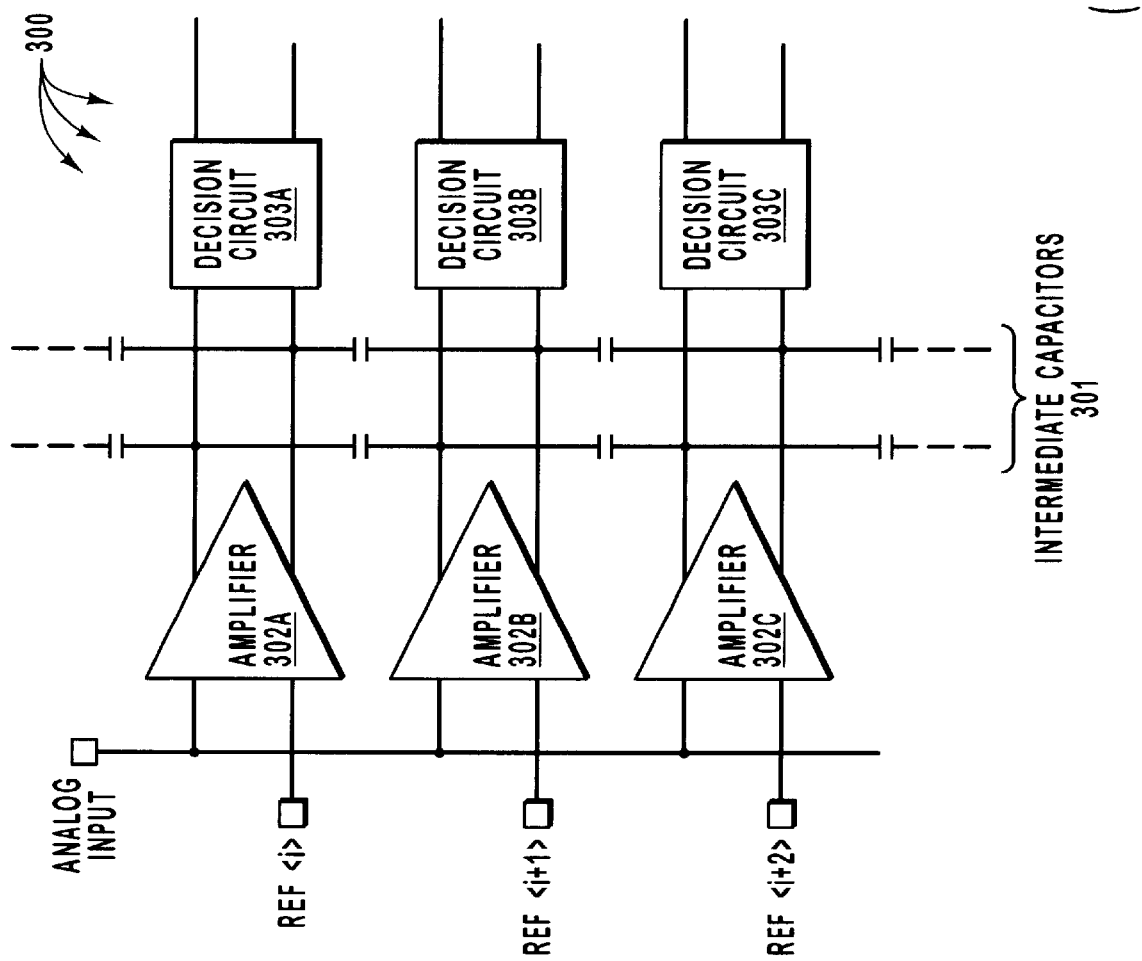
FIG. 3 is a circuit diagram of a conventional averaging circuit for use in analog-to-digital converters.
Figure 4:
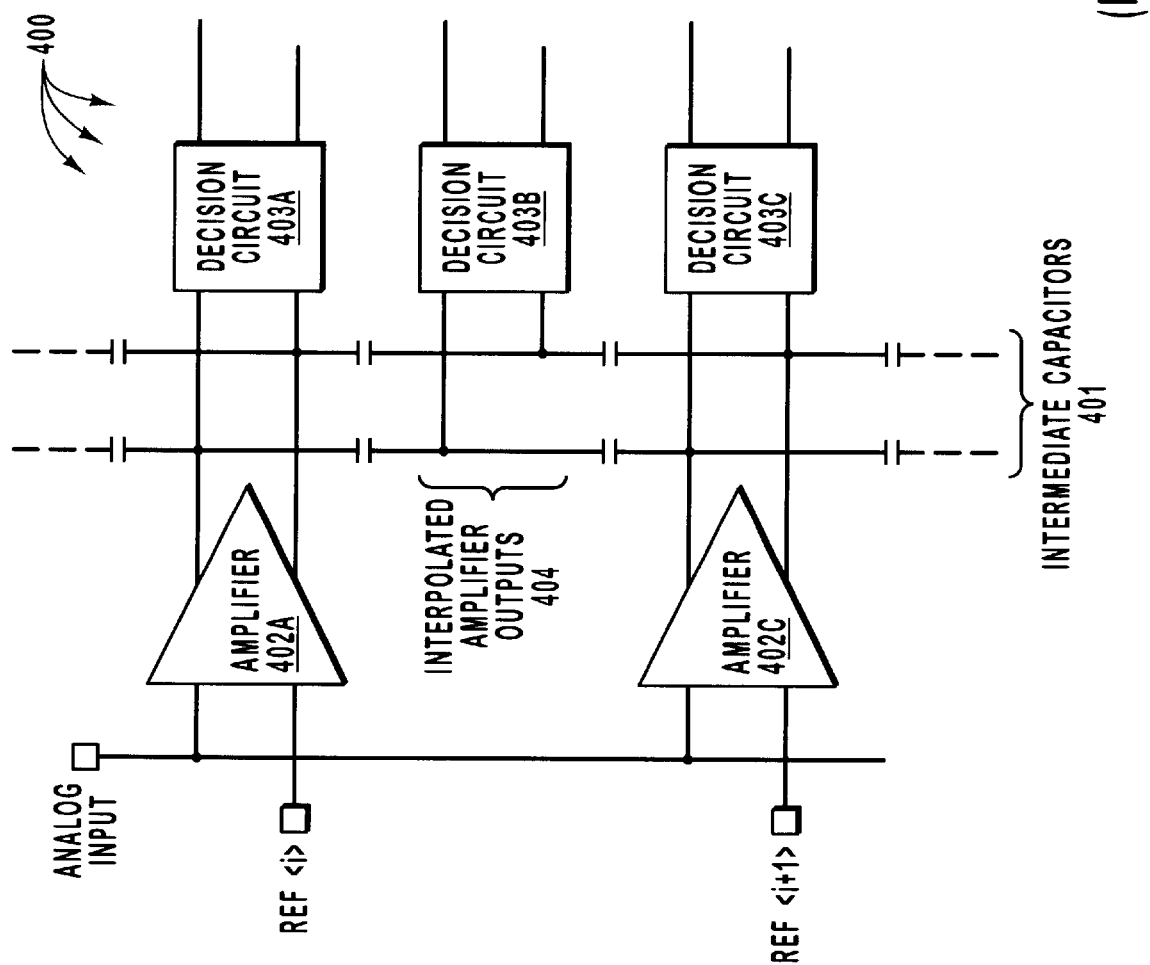
FIG. 4 is circuit diagram of a conventional interpolation circuit for use in analog-to-digital converters.
Figure 5:
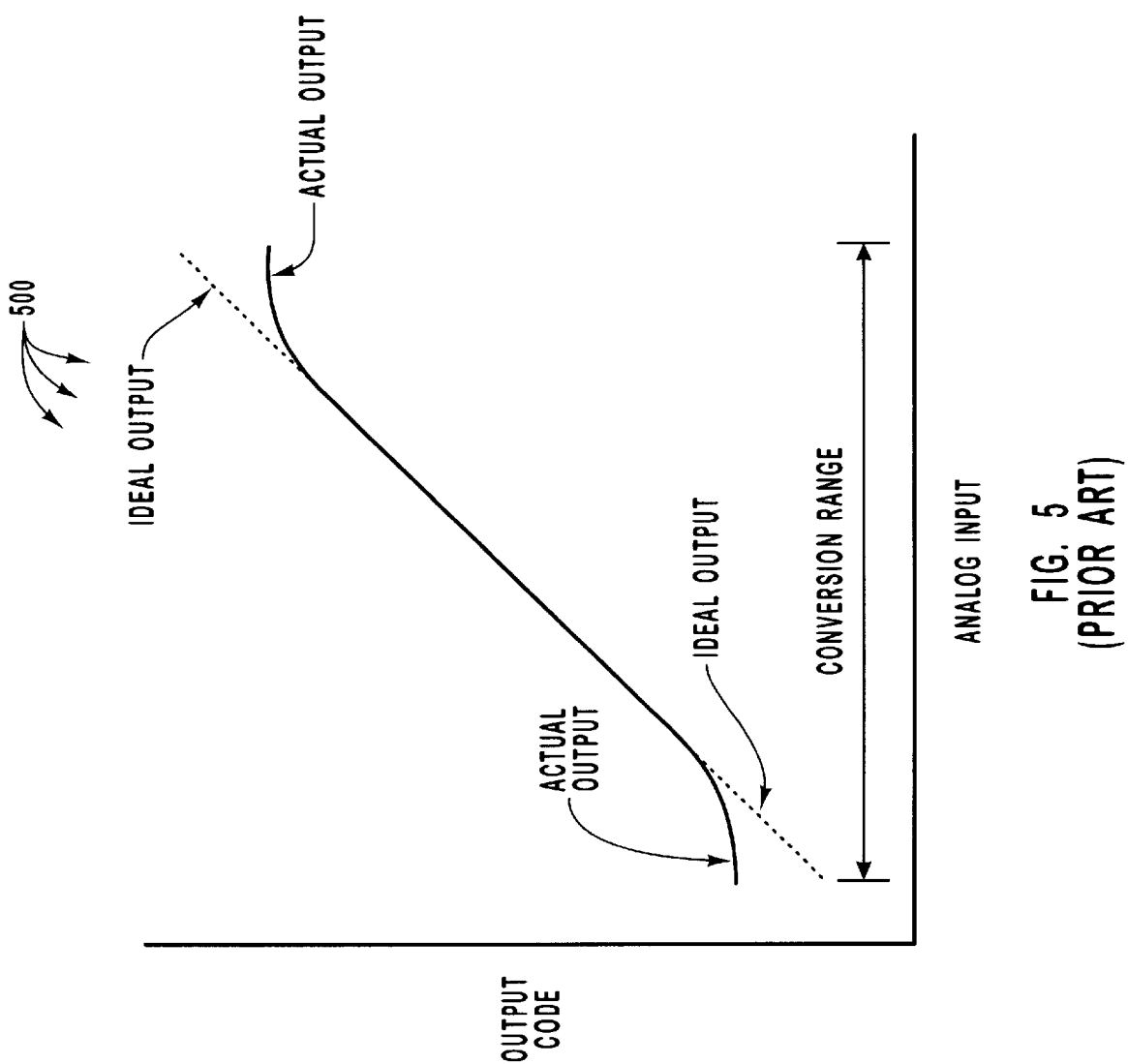
FIG. 5 is a graph of distortion that results when using conventional averaging and interpolation circuits.
Figure 6:
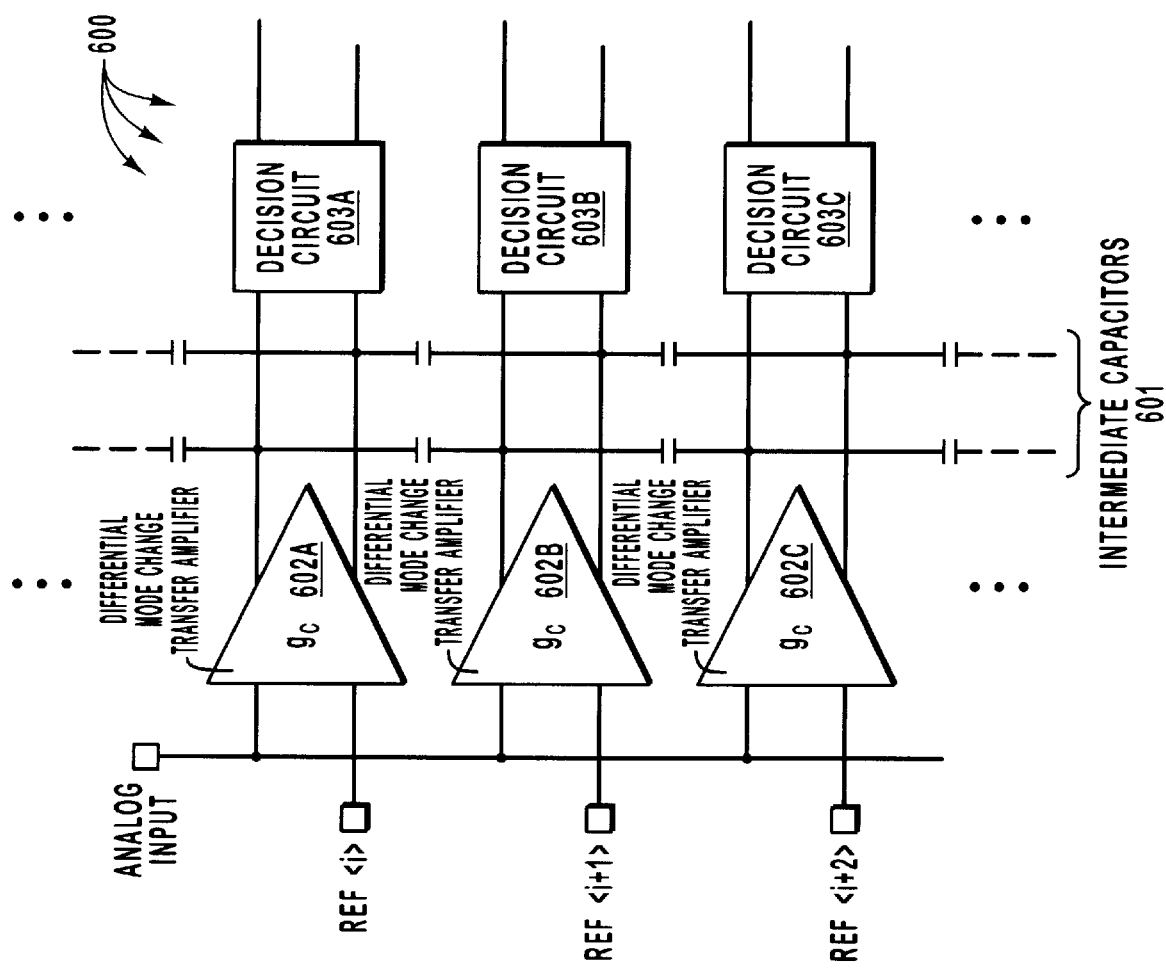
FIG. 6 is a circuit diagram of an averaging circuit utilizing differential mode charge transfer amplifiers in accordance with the present invention.

For example, FIG. 6 is a circuit diagram of an averaging circuit 600 utilizing differential mode CTAs in accordance with the present invention. Averaging circuit 600 includes differential mode CTAs 602A through 602C. The vertical sequences of three periods (vertical ellipses) above CTA 602A and below CTA 602C indicate that other CTAs, in addition to those illustrated, may be included in an amplifier array. Averaging circuit 600 also includes decision circuits 603A through 603C. The vertical sequences of three periods (vertical ellipses) above decision circuit 603A and below decision circuit 603C indicate that additional decision circuits may correspond to additional amplifiers of the amplifier array.

The capacitors of intermediate capacitors 601 cause adjacent output terminals, for example those of CTA 602A and CTA 602B, to share the charge transferred by CTAs 602A and 602B, thus tending to average any errors resulting from offset or mismatch. In addition, and in contrast to prior averaging schemes, the capacitors of intermediate capacitors 601 are also used by the CTAs, such as, for example, CTAs 602A through 602C, during the amplification process.

Figure 7:
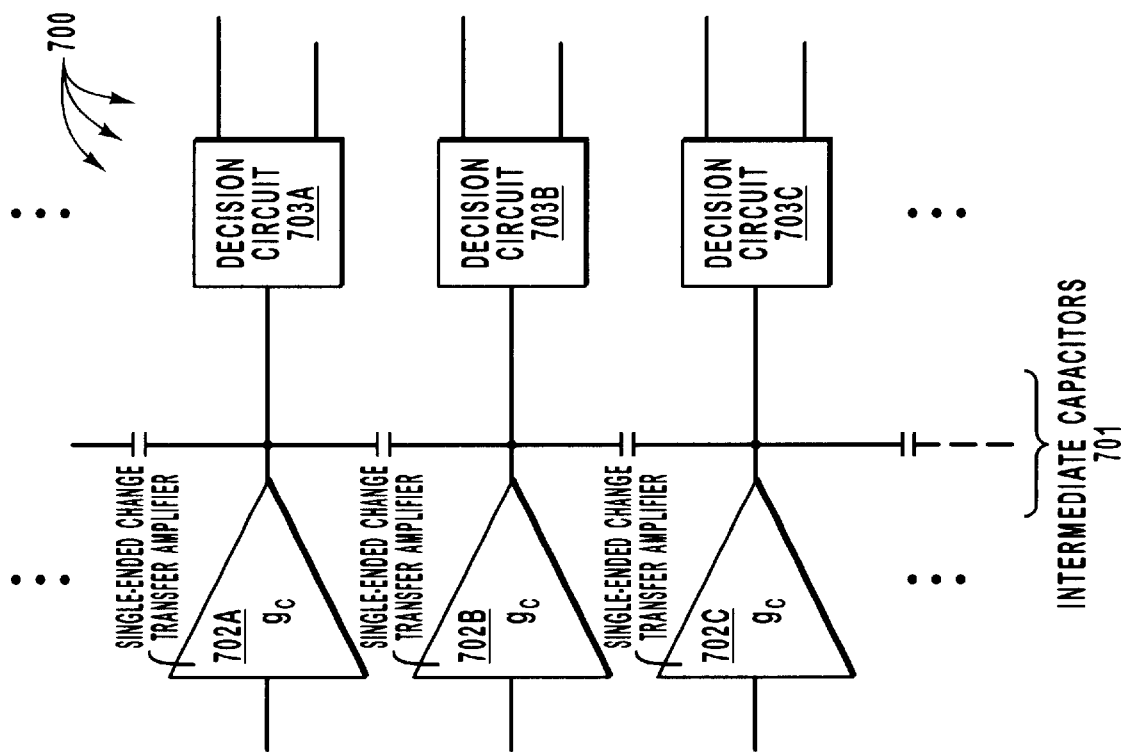
FIG. 7 is a circuit diagram of an averaging circuit utilizing single-ended charge transfer amplifiers in accordance with the present invention.

FIG. 7 is a circuit diagram of an averaging circuit 700 utilizing single-ended CTAs in accordance with the present invention. Similarly to FIG. 6, the intermediate capacitors of intermediate capacitors 701 cause adjacent output terminals of CTAs to share charge and, in contrast to prior averaging schemes, are also used by the CTAs during the amplification process.

Figure 8:
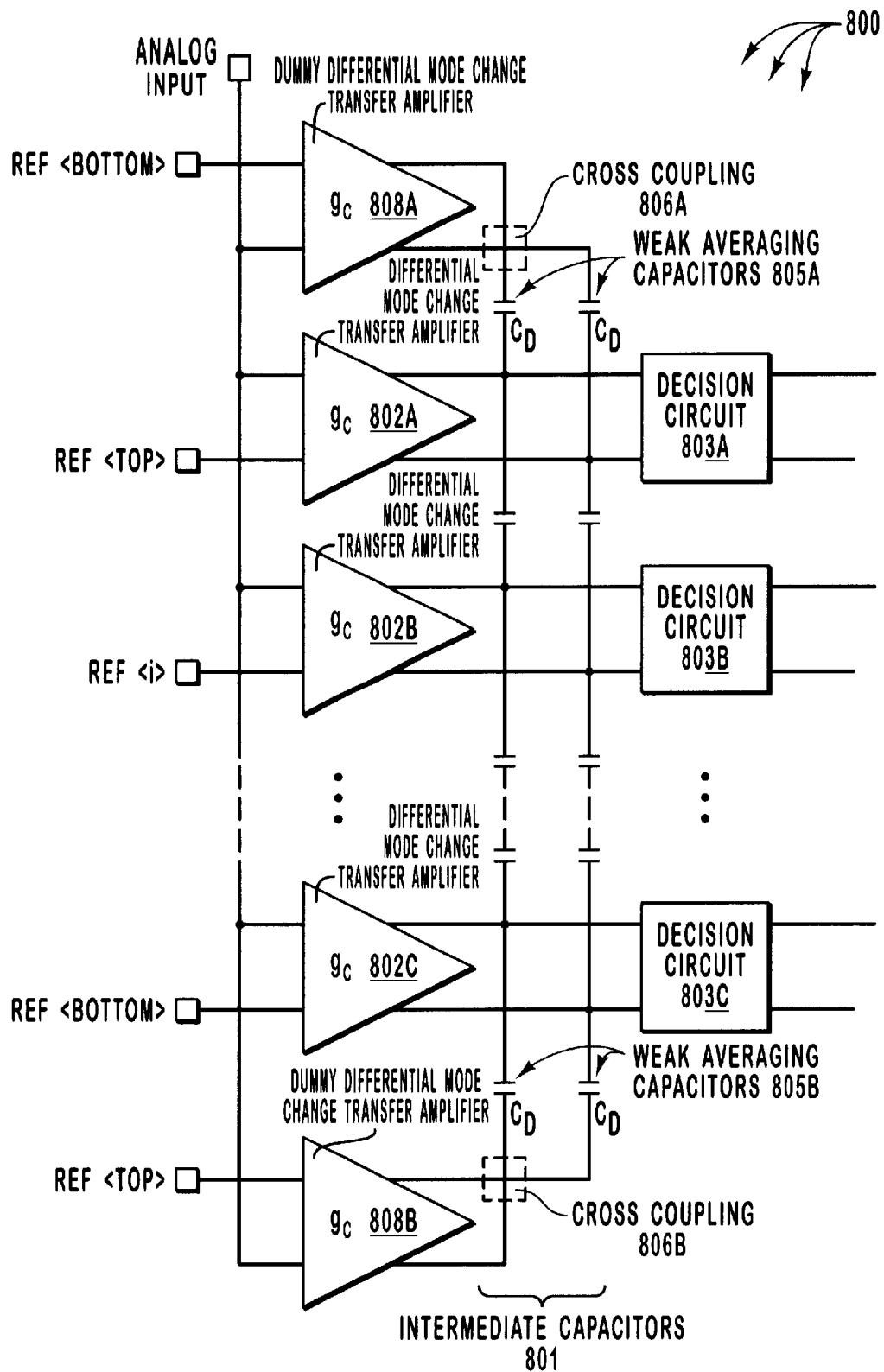
FIG. 8 is a circuit diagram of an averaging circuit that reduces distortion in accordance with the present invention.

FIG. 8 is a circuit diagram of an averaging circuit 800 that reduces distortion in accordance with the present invention. The CTAs in averaging circuit 800 are arranged in a linear configuration. Averaging circuit 800 includes dummy differential mode CTAs 808A and 808B. Shown at cross-coupling 806A, the outputs of dummy differential mode CTA 808A are inverted and coupled to weak averaging capacitors 805A. Weak averaging capacitors 805A are further coupled to the outputs of differential mode CTA 802A. Shown at cross-coupling 806B, the outputs of dummy differential mode CTA 808B are inverted and coupled to weak averaging capacitors 805B. Weak averaging capacitors 805B are further coupled to the outputs differential mode CTA 802C.

Further, the reference voltage "REF<BOTTOM>" is asserted at both an input terminal of dummy differential mode CTA 808A and an input terminal of differential mode CTA 802C (the "bottom" amplifier in the array). Likewise, the reference voltage "REF<TOP>" is asserted both at an input terminal of dummy differential mode CTA 808B and an input terminal of differential mode CTA 802A (the "top" amplifier in the array).

Figure 9:
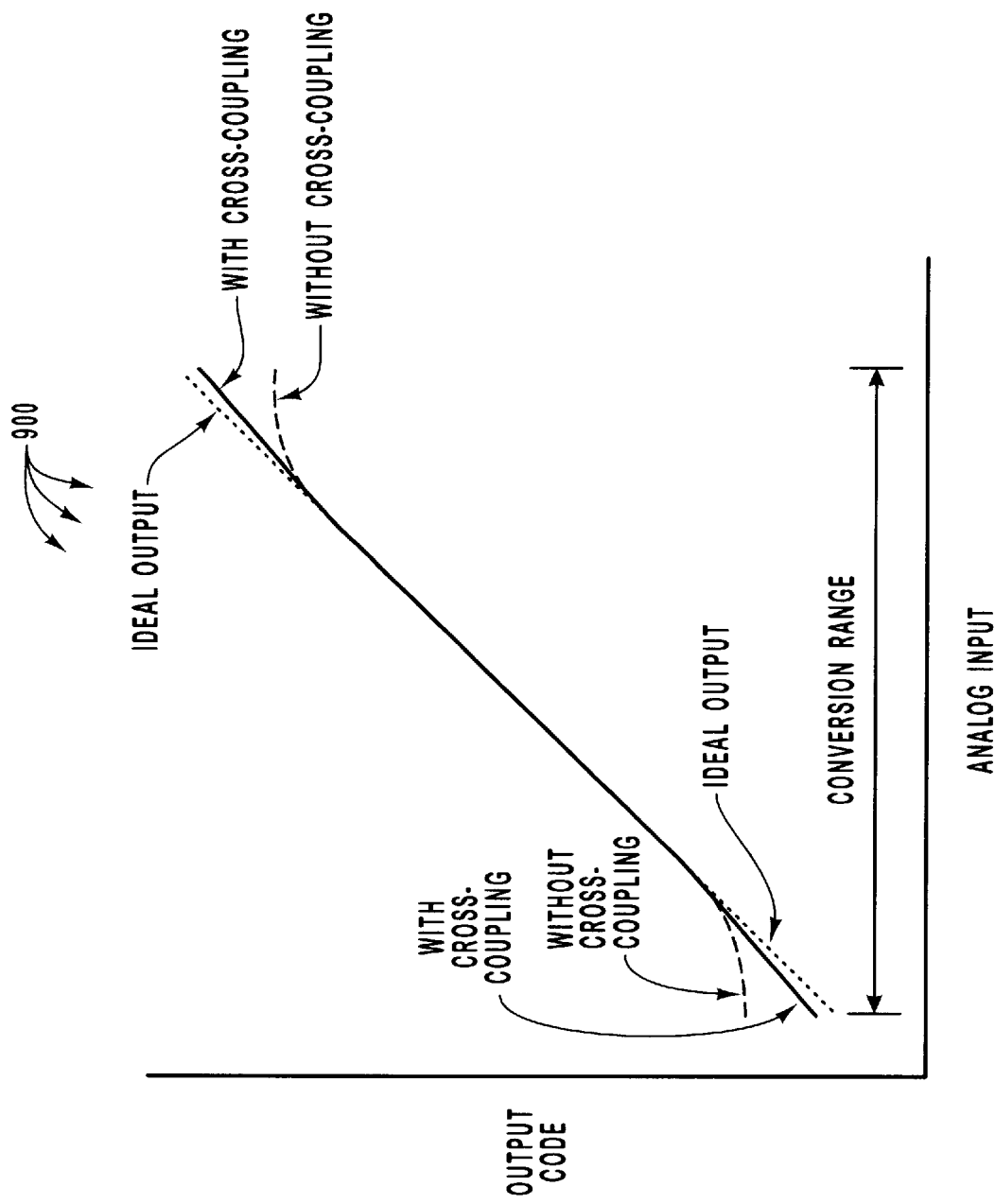
FIG. 9 is a graph comparing analog input to the output code of an averaging circuit in accordance with the present invention.

Cross-coupling has the effect of substantially reducing distortion at the ends of a conversion range (e.g. at CTA 802A and CTA 802C). FIG. 9 illustrates graph 900 that includes an ideal output as a dotted line, the output without cross-coupling as a dashed line, and the output with cross-coupling as a solid line. As shown in FIG. 9, the output with cross-coupling is substantially closer to the ideal output than the output without cross-coupling.

Figure 10:
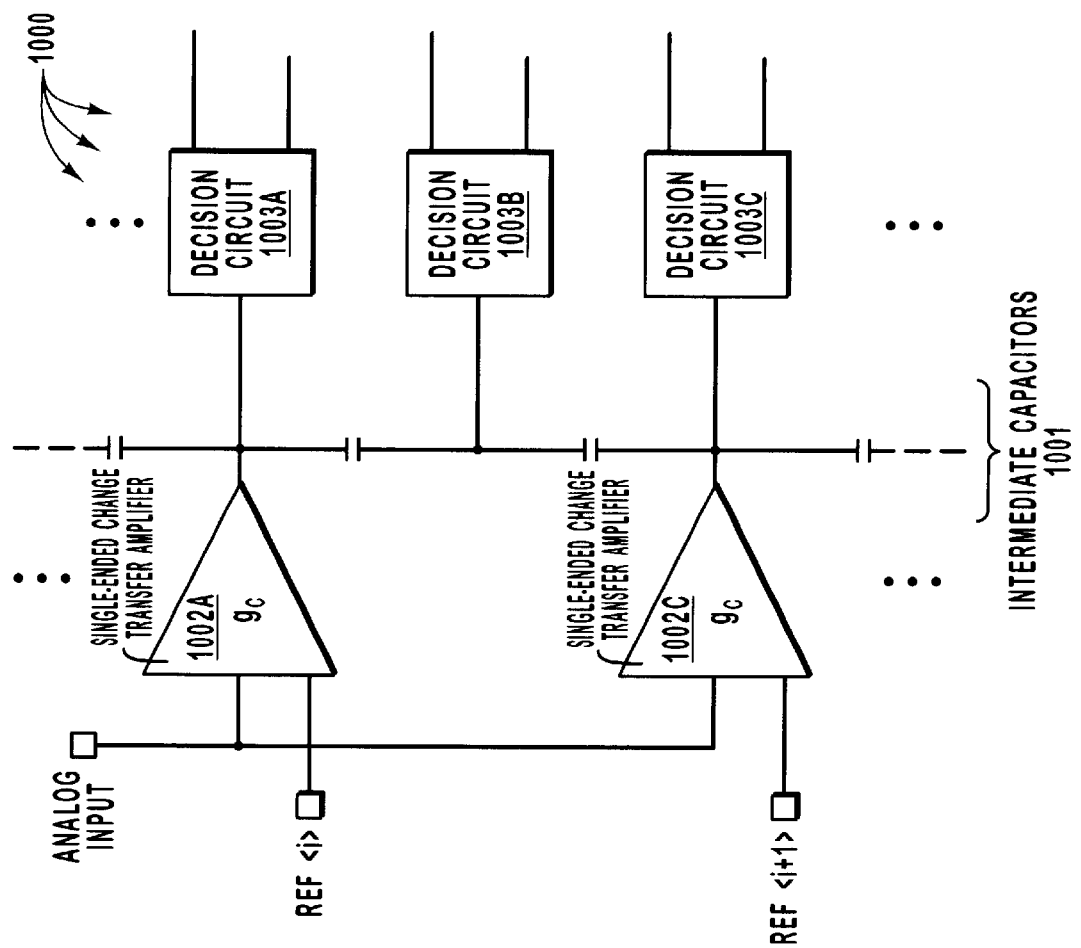
FIG. 10 is a circuit diagram of an interpolation circuit utilizing single-ended charge transfer amplifiers in accordance with the present invention.

FIG. 10 is a circuit diagram of an interpolation circuit 1000 in accordance with the present invention. Interpolation circuit 1000 includes an array of single-ended CTAs including singled-ended CTAs 1002A and 1002C. Similarly to the averaging circuits previously described, intermediate capacitors 1001 serve multiple purposes. Intermediate capacitors 1001 may act to cause an interpolated signal, of a magnitude in between the magnitudes of the signals at the output terminals of single-ended CTA 1102A and single-ended CTA 1002C, to be asserted as an input signal to decision circuit 1103B. Additionally, intermediate capacitors 1001 may serve as charge conveying load devices for the charge transfer amplifiers included in interpolation circuit 1000 (e.g. single-ended CTAs 1102A and 1102C).

Figure 11:
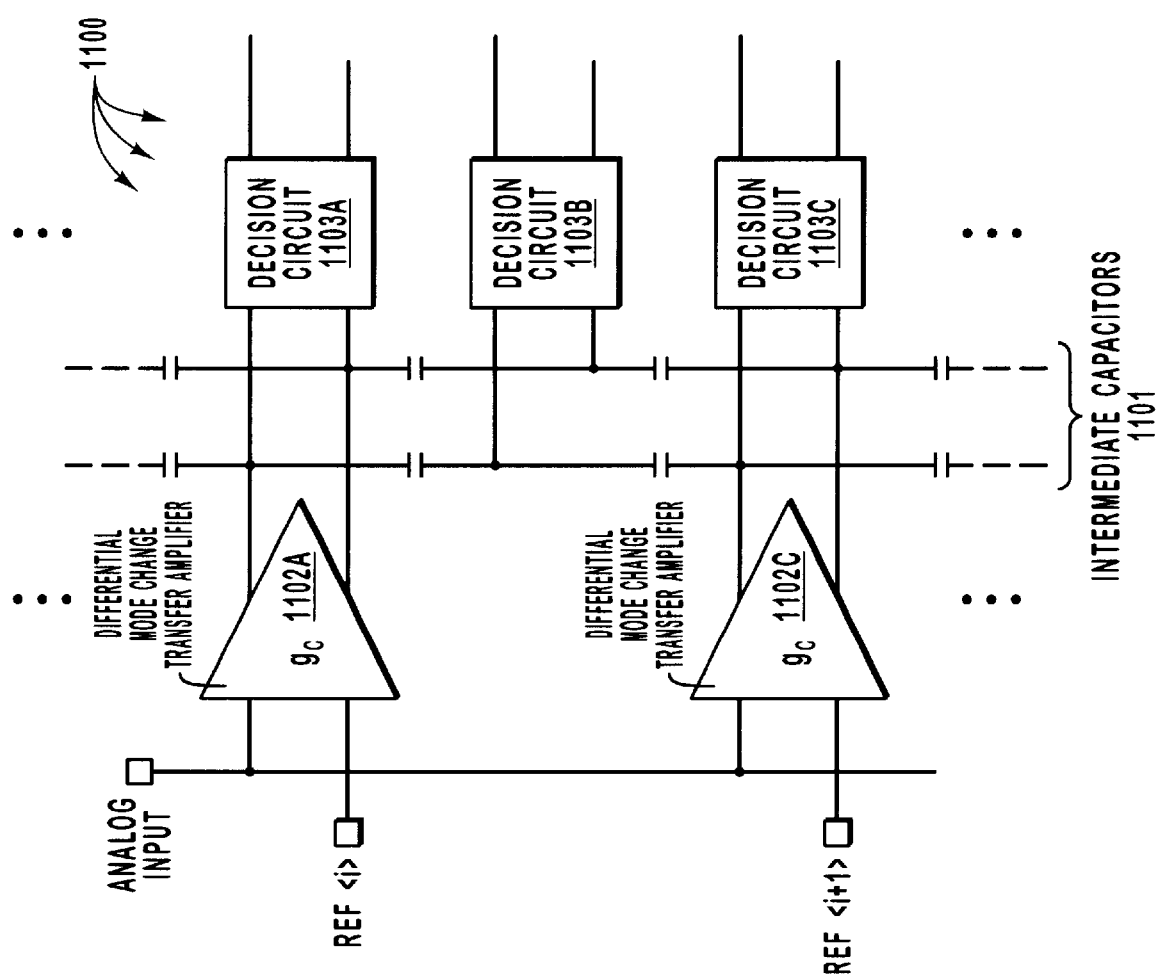
FIG. 11 is a circuit diagram of an interpolation circuit utilizing differential mode charge transfer amplifiers in accordance with the present invention.

FIG. 11 is a circuit diagram of an interpolation circuit 1100 in accordance with the present invention. Interpolation circuit 1100 includes an array of differential mode CTAs including differential mode CTAs 1102A and 1102C. Similarly to FIG. 10, intermediate capacitors 1101 serve as both interpolating capacitors and as charge conveying load devices.

Figure 12:
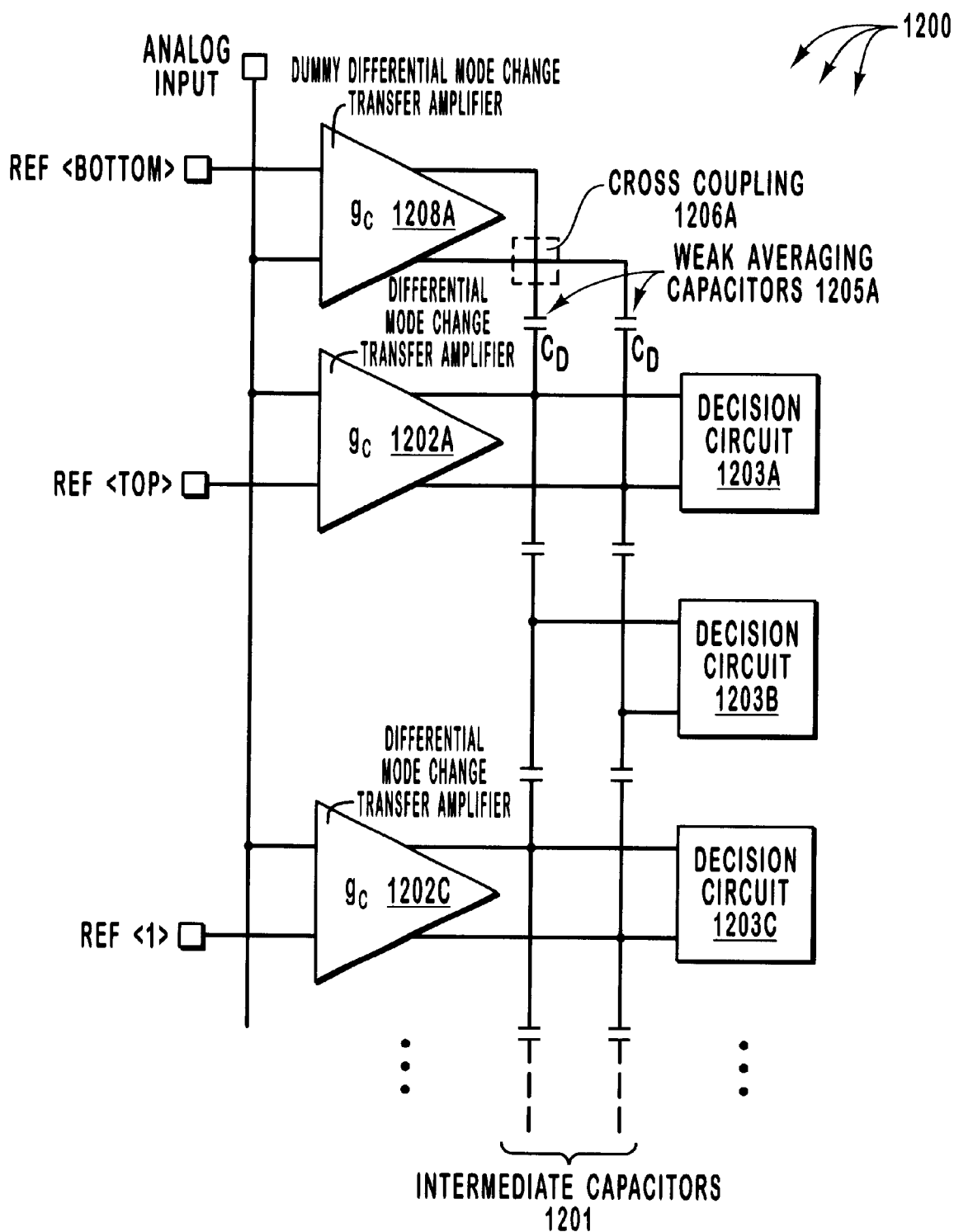
FIG. 12 is a circuit diagram of an interpolation circuit that reduces distortion in accordance with the present invention.

FIG. 12 is a circuit diagram of interpolation circuit 1200 that reduces distortion in accordance with the present invention. The CTAs in interpolation circuit 1200 are arranged in a linear configuration. Averaging circuit 1200 includes dummy differential mode CTA 1208A. Shown at cross-coupling 1206A, the outputs of dummy differential mode CTA 1208A are inverted and coupled to weak averaging capacitors 1205A. Weak averaging capacitors 1205A are further coupled to the outputs differential mode CTA 1202A. Similar to FIG. 8, another dummy differential mode CTA, cross-coupling, and weak averaging capacitors may be included at the "bottom" of the amplifier array shown in FIG. 12. Further, the reference voltages "REF<BOTTOM>" and "REF<TOP>" may be asserted in a manner similar to FIG. 8. The interpolation circuit 1200 produces output characteristics similar to those shown in FIG. 9.

Figure 13:
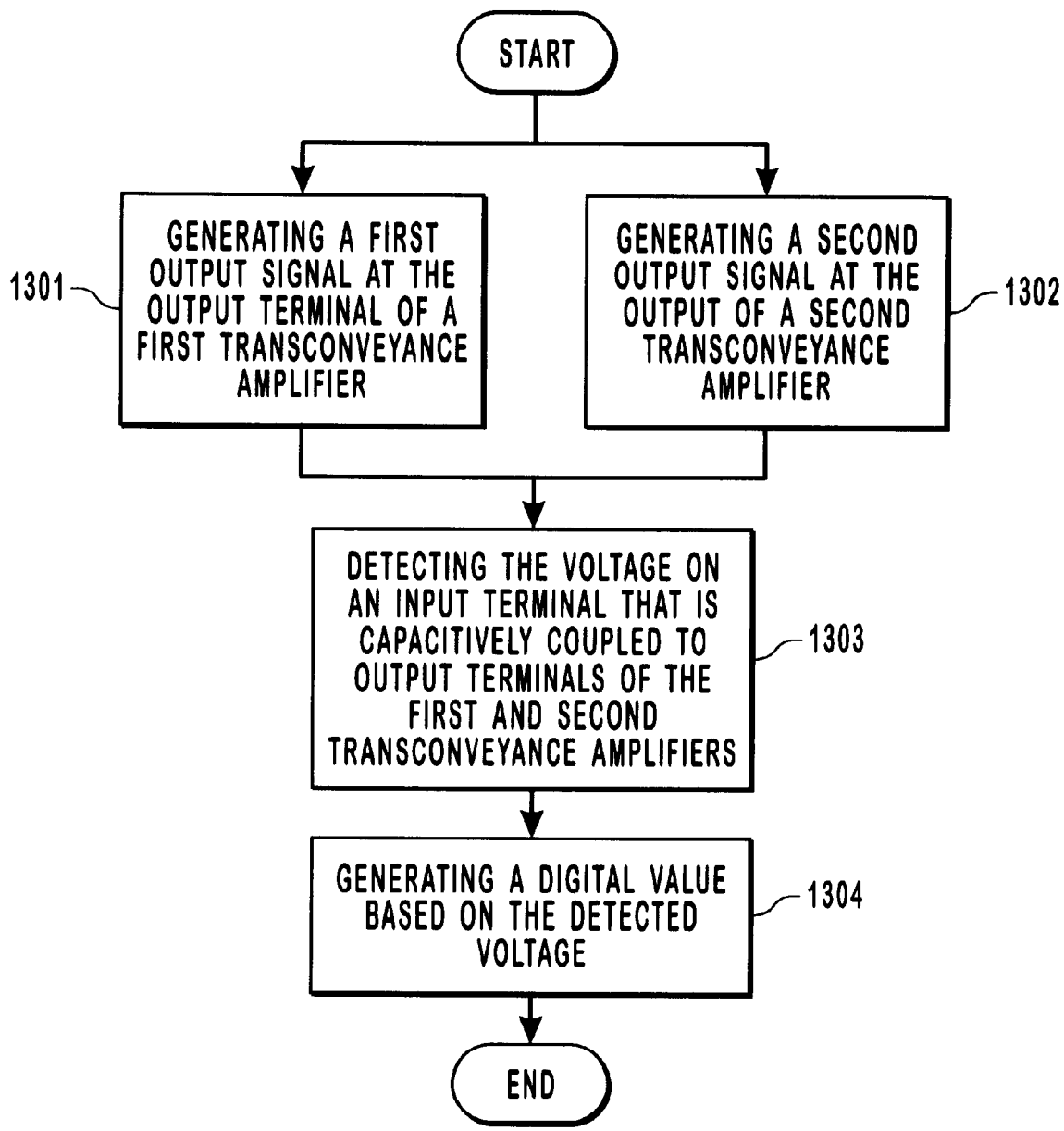
FIG. 13 is flow diagram illustrating an example of a method for utilizing the output of charge transfer amplifiers to generate a digital value in an analog-to-digital converter.

FIG. 13 is flow diagram illustrating an example of a method generating a digital value in an analog-to-digital converter. The method in FIG. 13 includes an act of generating a first output signal at the output terminal of a first transconveyance amplifier (act 1301). Act 1301 may include generating an output signal at an output terminal of a CTA in an averaging circuit, such as, for example, single-ended CTA 702A in FIG. 7. Similarly, act 1301 may include generating an output signal at an output terminal of a CTA in an interpolation circuit, such as, for example, single-ended CTA 1002A in FIG. 10.

Parallel to act 1301, the method in FIG. 13 includes an act of generating a second output signal at the output terminal of a second transconveyance amplifier (act 1302). Act 1302 may include generating an output signal at an output terminal of a CTA in an averaging circuit, such as, for example, single-ended CTA 702C in FIG. 7. Similarly, act 1302 may include generating an output signal at an output terminal of a CTA in an interpolation circuit, such as, for example, single-ended CTA 1002C in FIG. 10.

It should be understood that differential mode CTAs included in averaging circuits (e.g. averaging circuit 800) or interpolation circuits (e.g. interpolation circuit 1100) may also generate output signals.

After generating output signals, the voltage on an input terminal that is capacitively coupled to the output terminals of the first and second transconveyance amplifiers is detected (act 1303). Act 1303 may include detecting the voltage on input terminal of a decision circuit in an averaging circuit, such as, for example, decision circuit 703B in FIG. 7. As illustrated in FIG. 7, decision circuit 703B is capacitively coupled to the output terminals of both single-ended CTA 702A and single-ended CTA 702C through intermediate capacitors 701. Similarly, act 1303 may include detecting the voltage on input terminal of a decision circuit in an interpolation circuit, such as, for example, decision circuit 1003B in FIG. 10. As illustrated in FIG. 10, decision circuit 1003B is capacitively coupled to the output terminals of both single-ended CTA 1002A and single-ended CTA 1002C through intermediate capacitors 1001.

It should be understood that the voltage on an input terminal may also be detected in averaging circuits (e.g. averaging circuit 800) or interpolation circuits (e.g. interpolation circuit 1100) that include differential mode CTAs.

A digital value is generated based on the detected voltage (act 1304). This may include a decision circuit, such as, for example, decision circuit 703B generating a digital value based on a voltage detected at the input terminal of decision circuit 703B. In some cases, when the voltage is above a specified threshold a digital "1" is generated and when the voltage is below the specified threshold a digital "0" is generated. In other cases, when the voltage is below a specified threshold a digital "1" is generated and when the voltage is above the specified threshold a digital "0" is generated. The generated digital value may be combined with other digital values to provide a meaningful digital representation of an analog signal, such as, for example, a sound, motion, vibration, light intensity, or electrical signal.

Since voltage-to-charge amplifiers manage charge rather than current to produce voltage gain, utilizing voltage-to-charge amplifiers, such as, for example, CTAs, may significantly reduce the power dissipation of an ADC. Further, capacitors associated with the CTAs of an ADC may serve multiple functions, such as, for example, acting as both an averaging capacitor and a charge conveying load device.

Figure 14:
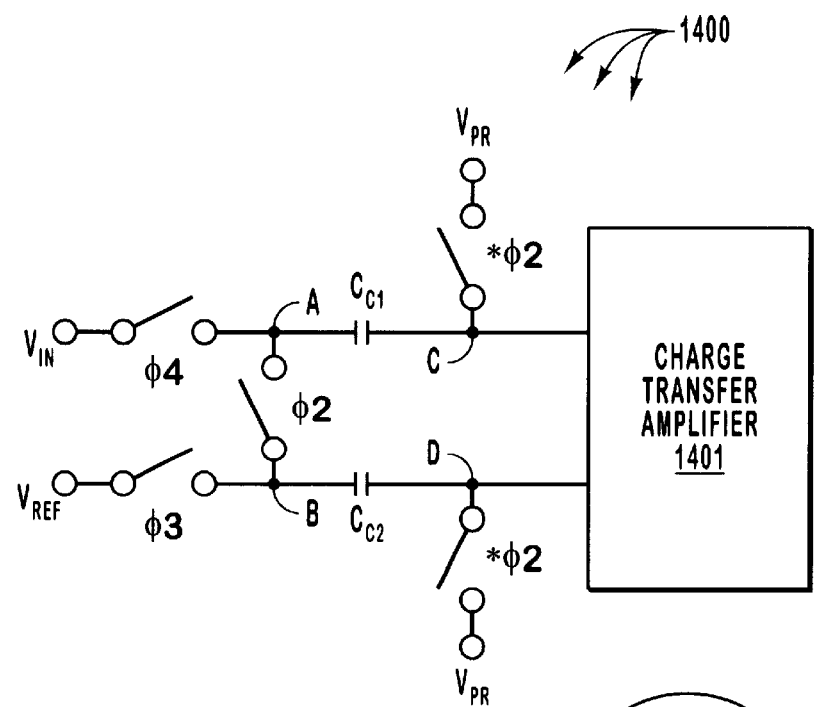
FIG. 14 is a circuit diagram of a sampling circuit in accordance with the present invention.

The second inventive concept of sample and hold circuits that use the coupling capacitors of a charge transfer amplifier to sample and hold an analog signal will now be described. FIG. 14 is a circuit diagram of a sampling circuit 1500 in accordance with the present invention. Sampling circuit 1400 includes CTA 1401, which may be a CTA contained in a fine flash converter, such as, for example, in fine bank of CTAs 2505 in FIG. 25. Sampling circuit 1400 is useful in that, in addition to being DC coupling capacitors to aid in dynamic biasing, coupling capacitors $C_{C1}$ and $C_{C2}$ act as sample-and-hold capacitors. The sample-and-hold functionality of coupling capacitors $C_{C1}$ and $C_{C2}$ eliminates the need for a separate sample-and-hold circuit in a subranging ADC.

Figure 15:
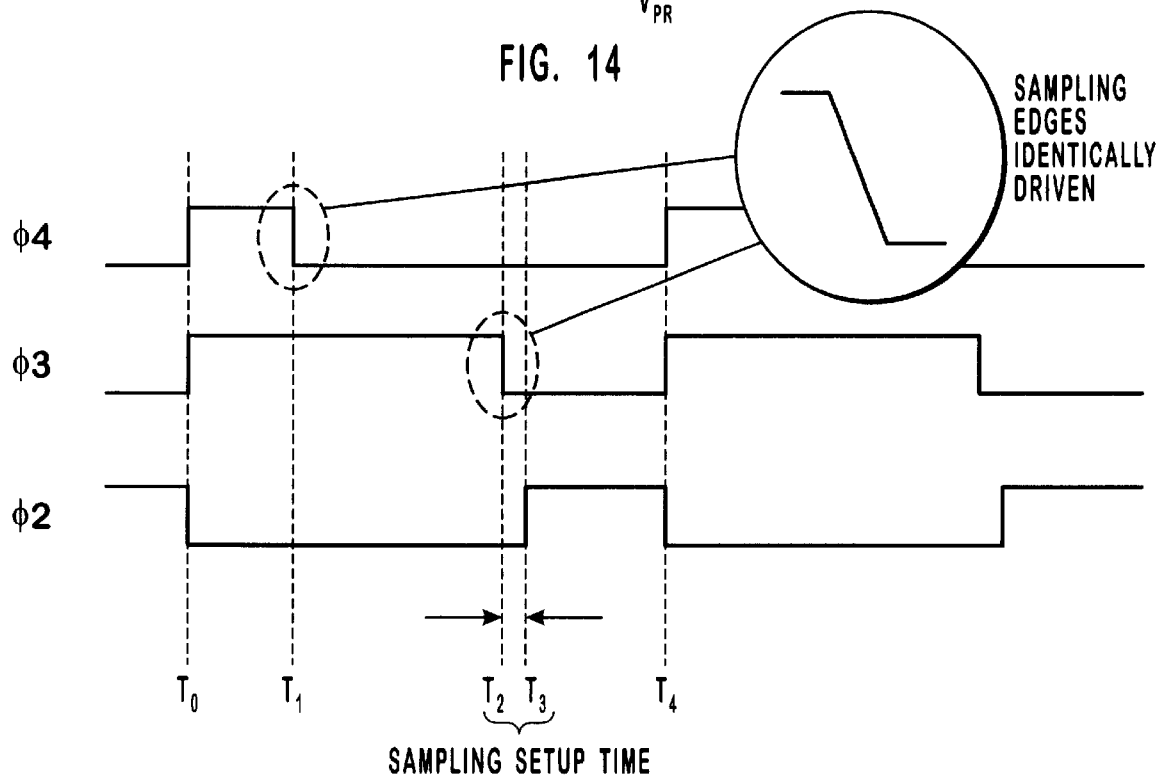
FIG. 15 is a timing diagram of several waveforms used to control switches Φ1, Φ2, and Φ3 in order to properly operate the sampling circuit of FIG. 14.

FIG. 15 is a timing diagram of several waveforms used to control switches $\Phi 2$, $\Phi 3$, and $\Phi 4$ in order to properly operate the sampling circuit of FIG. 14 in accordance with the present invention. A high input signal $\Phi 2$, $\Phi 3$, or $\Phi 4$ indicates that the corresponding switch $\Phi 2$, $\Phi 3$, or $\Phi 4$ is closed, and a low input signal $\Phi 2$, $\Phi 3$, or $\Phi 4$ indicates that the corresponding switch $\Phi 2$, $\Phi 3$, or $\Phi 4$ is open. On the other hand, a high input signal $\Phi 2$ indicates that the corresponding switch $*\Phi 2$ is open, and a low input signal $\Phi 2$ indicates that the corresponding switch $*\Phi 2$ is closed. Switches labeled with an asterisk operate essentially in the inverse to switches that are not labeled with an asterisk. For example, a switch $\Phi 2$ will always be in the opposite state (whether that be open or closed) of a switch $*\Phi 2$.

Between time $T_0$ and $T_1$, the switches of FIG. 14 would have the configuration defined in Table 1.

TABLE 1

| Switch | Status |
| --- | --- |
| $\Phi 2$ | Open |
| $*\Phi 2$ | Closed |
| $\Phi 3$ | Closed |
| $\Phi 4$ | Closed |

During the time between $T_0$ and $T_1$ the voltage $V_{IN}$ is asserted at node A, the voltage $V_{REF}$ is asserted at node B, and the voltage $V_{PR}$ is asserted at nodes C and D. $V_{IN}$ may be analog input 2507 from FIG. 25 and $V_{REF}$ may be an output of fine reference analog mux 2504 from FIG. 25.

Between time $T_1$ and $T_2$ the switches of FIG. 14 would have the configuration defined in Table 2.

TABLE 2

| Switch | Status |
|---|---|
| Φ2 | Open |
| *Φ2 | Closed |
| Φ3 | Closed |
| Φ4 | Open |

During the time period between $T_1$ and $T_2$ the voltage at node A floats, but remains approximately at the value of $V_{IN}$ due to capacitor $C_{C1}$. Thus, the voltage at node A is held approximately at the value of $V_{IN}$ although no active signal is applied at node A. This allows the time period from $T_1$ to $T_2$ for the voltage $V_{REF}$ to settle. The time period from $T_1$ to $T_2$ may be viewed as predetermined time for allowing a fine reference voltage determined by a coarse bank of CTAs to settle. If CTA 1401 were included in fine bank of CTAs 2505, this may include CTA 1401 holding analog input 2507 for the time period from $T_1$ to $T_2$ while coarse bank of CTAs 2501, resistor reference ladder 2503, and fine reference analog mux 2504 generate a fine reference voltage. Since the voltage $V_{IN}$ is held at node A by coupling capacitor $C_{C1}$, there is no need for a separate hold circuit to hold the value of $V_{IN}$ while a fine reference voltage settles.

Between time $T_2$ and $T_3$ the switches of FIG. 14 would have the configuration defined in Table 3.

TABLE 3

| Switch | Status |
|---|---|
| Φ2 | Open |
| *Φ2 | Closed |
| Φ3 | Open |
| Φ4 | Open |

During the time period between $T_2$ and $T_3$ the voltage at node A floats, but remains approximately at the value of $V_{IN}$ due to capacitor $C_{C1}$. Likewise, the voltage at node B floats but remains approximately at the value of $V_{REF}$ due to capacitor $C_{C2}$. Thus, the voltages at nodes A and B are held although no active signals are applied at node A or node B. The time period from $T_2$ to $T_3$ sets up CTA 1401 for sampling voltage values at nodes C and D.

Between time $T_3$ and $T_4$ the switches of FIG. 14 would have the configuration defined in Table 4.

TABLE 4

| Switch | Status |
|---|---|
| Φ2 | Closed |
| *Φ2 | Open |
| Φ3 | Open |
| Φ4 | Open |

During the time period between $T_3$ and $T_4$, current flows through the switch Φ2, the direction of current depending on which of $V_{IN}$ or $V_{REF}$ is higher. Accordingly, the voltage at one of node A or node B will rise, while the voltage at the other of node A or node B will fall. Which node will rise, and which node will fall also depends on which of $V_{IN}$ or $V_{REF}$ is higher. Due to the capacitive coupling effect through capacitor $C_{C1}$ and $C_{C2}$, one of the node C and node D will rise, while the other of node C and node D will fall, depending on which of $V_{IN}$ or $V_{REF}$ is higher. Since node C and node D were at the same precharge voltage prior to time $T_3$, this means that which of node C and node D have a higher voltage will depend on which of $V_{IN}$ or $V_{REF}$ was higher at time $T_3$. Accordingly, the charge transfer amplifier 1401 will accurately compare the voltages $V_{IN}$ and $V_{REF}$.

Those skilled in the art will recognize, after having reviewed this description, that any switch illustrated and/or described herein may be replaced by more than one switch in order to obtain identical functionality. Wherever a single switch is illustrated in this description, those skilled in the art will recognize that a single switch may symbolically represent multiple switches and still be with in the principles of the present invention.

Figure 16:
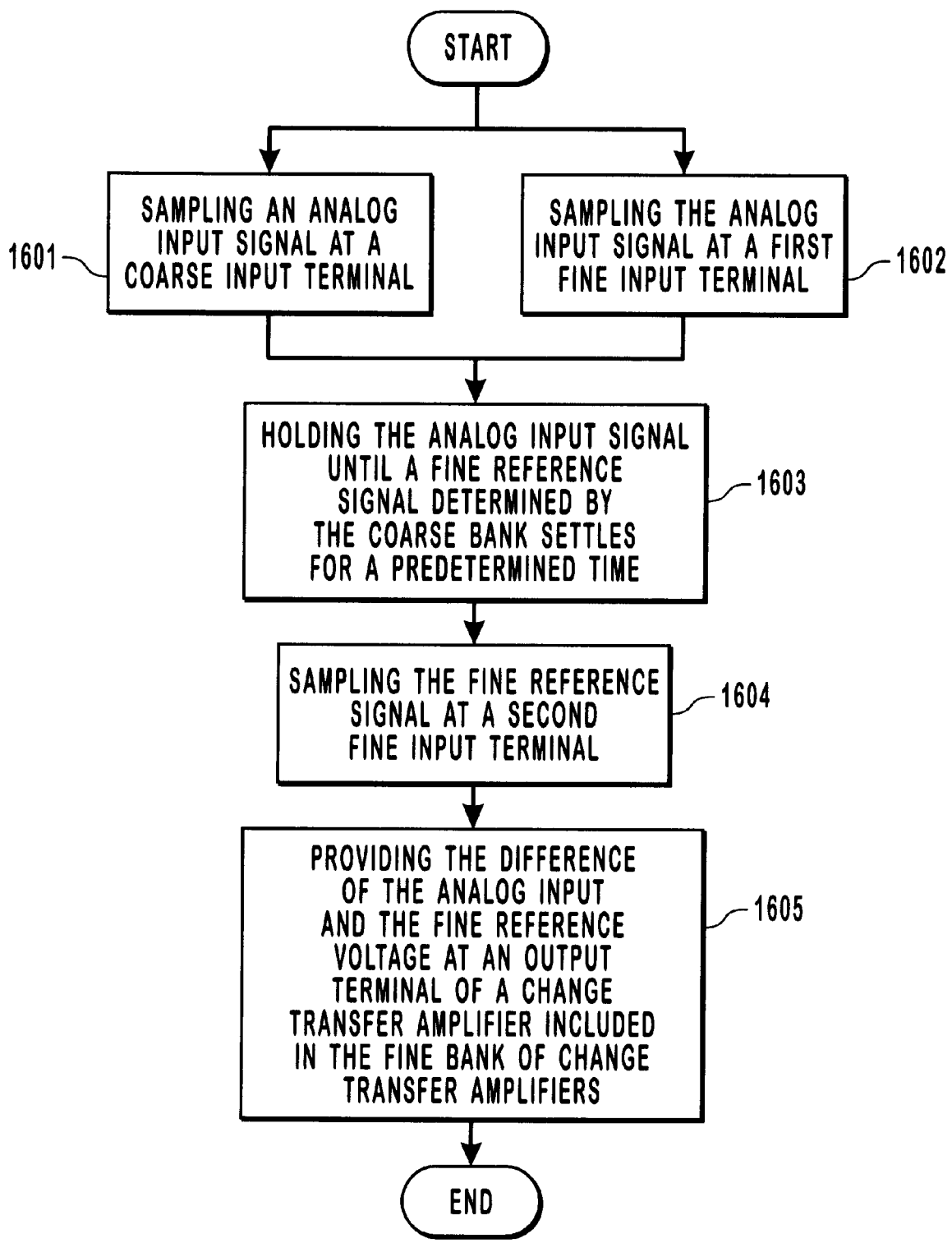
FIG. 16 is a flow diagram illustrating an example of a method for sampling input signals at charge transfer amplifiers in the fine section of a subranging analog-to-digital converter.
Figure 25:
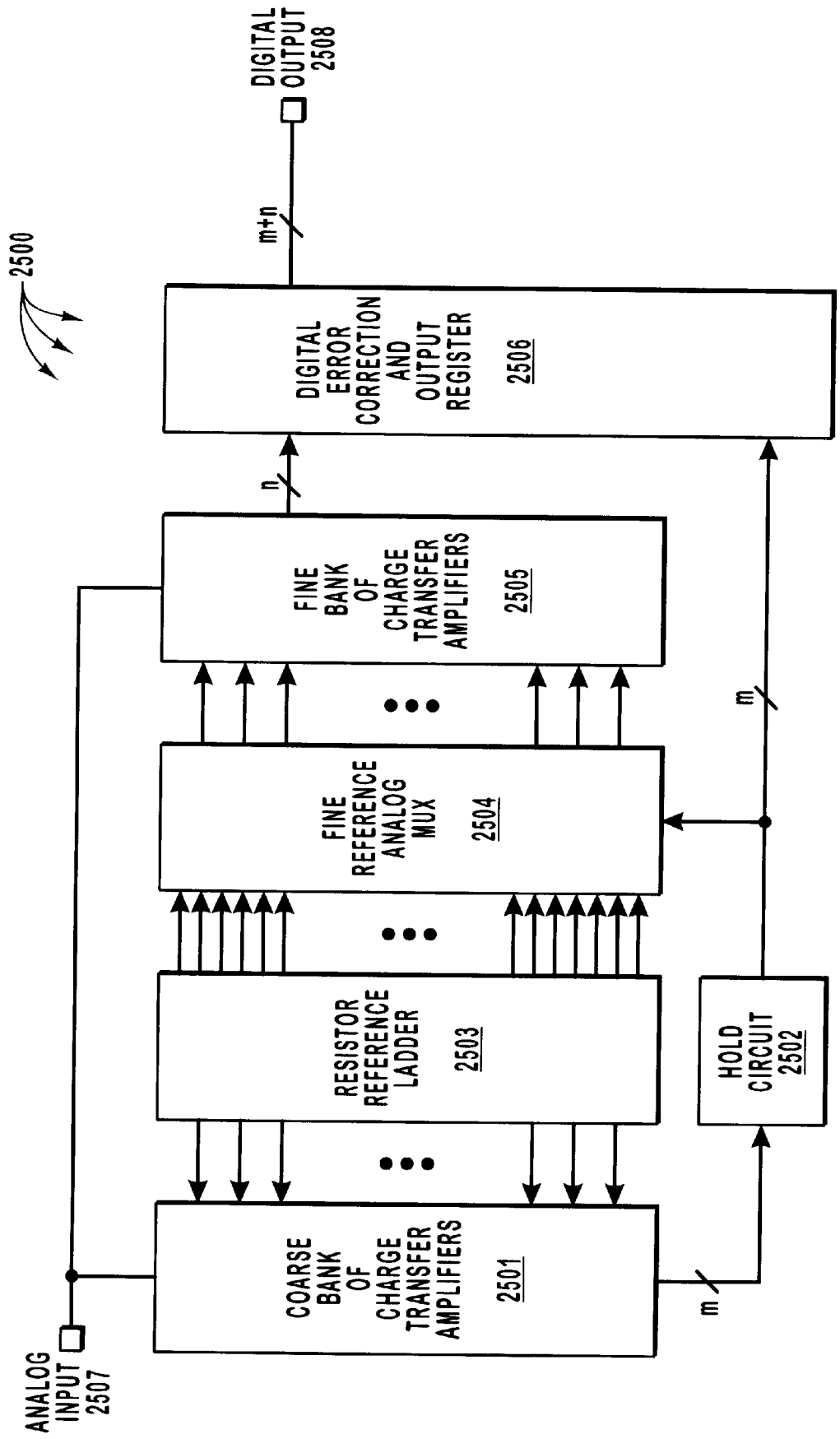
FIG. 25 is a circuit diagram of a subranging analog-to-digital converter in accordance with the present invention.

FIG. 16 is a flow diagram illustrating an example of a method for sampling input signals at CTAs in the fine section of a subranging analog-to-digital converter. The method in FIG. 16 includes an act of sampling an analog input signal at a coarse input terminal (act 1601). In FIG. 25, act 1601 may include sampling the analog input 2507 at an input terminal of a CTA included in coarse bank of CTAs 2501. Parallel to act 1601, the method in FIG. 16 includes an act of sampling the analog input at a first fine input terminal (act 1602). In FIG. 25, act 1602 may include sampling the analog input 2507 at an input terminal of a CTA included in fine bank of CTAs 2505 (e.g. CTA 1401).

After sampling, the analog input signal is held until a fine reference signal determined by the coarse bank settles for a predetermined time (act 1603). Fine bank of CTAs 2505 may include a plurality of sampling circuits similar to the sampling circuit in FIG. 16. Each sampling circuit may receive the value of analog input signal 2507 (e.g. $V_{IN}$). Further, each sampling circuit may receive a different reference voltage ($V_{REF}$) from fine reference analog mux 2504. The sampling circuits may hold the value of analog input signal (e.g. at node A in FIG. 14) until corresponding reference voltages settle.

After allowing fine reference settling, a fine reference signal is sampled at a second fine input terminal (act 1604). This may include each sampling circuit in fine bank of CTAs 2505 sampling a corresponding reference voltage ($V_{REF}$), such as, for example, the value of a voltage that was asserted at node B in FIG. 14.

The amplified difference of the analog input and the fine reference voltage is provided at an output terminal of a charge transfer amplifier included in the fine bank of charge transfer amplifiers (act 1605). When the CTAs included in fine bank of CTAs 2505 are configured similarly to CTA 1401 of FIG. 14, $V_{IN}$ may correspond to analog input 2507 and $V_{REF}$ may correspond to a fine reference voltage from fine reference analog mux 2504. A CTA included in fine bank of charge transfer amplifiers 2505 may provide the difference of analog input 2507 and one of the fine reference voltages generated by fine reference analog mux 2504. When CTAs are configured similarly to CTA 1401, the need for a separate sample and hold circuit is eliminated.

Fine bank of CTAs 2505 may utilize analog input 2507 and the output signals of fine reference analog mux 2504 to generate fine digital values. The fine digital values and coarse digital values are combined by digital error correction and output register 2506 to generate digital output 2508.

By using a number of sample and hold circuits as illustrated in FIG. 14, sample and hold functionality is built into existing components of an ADC in a distributed manner.

Thus, an error in the sample and hold functionality of one portion of an ADC will have minimal, if any, affect on other portions of the ADC.

Figure 17:
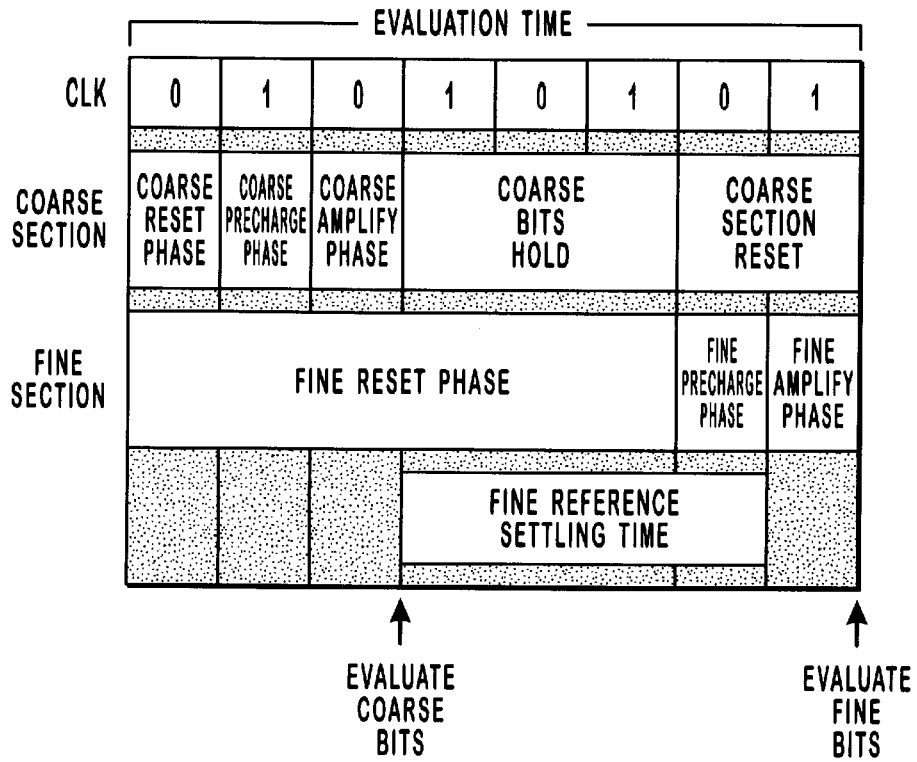
FIG. 17 is a chart illustrating an example of a timing diagram for allowing fine reference values to settle.
Figure 18:
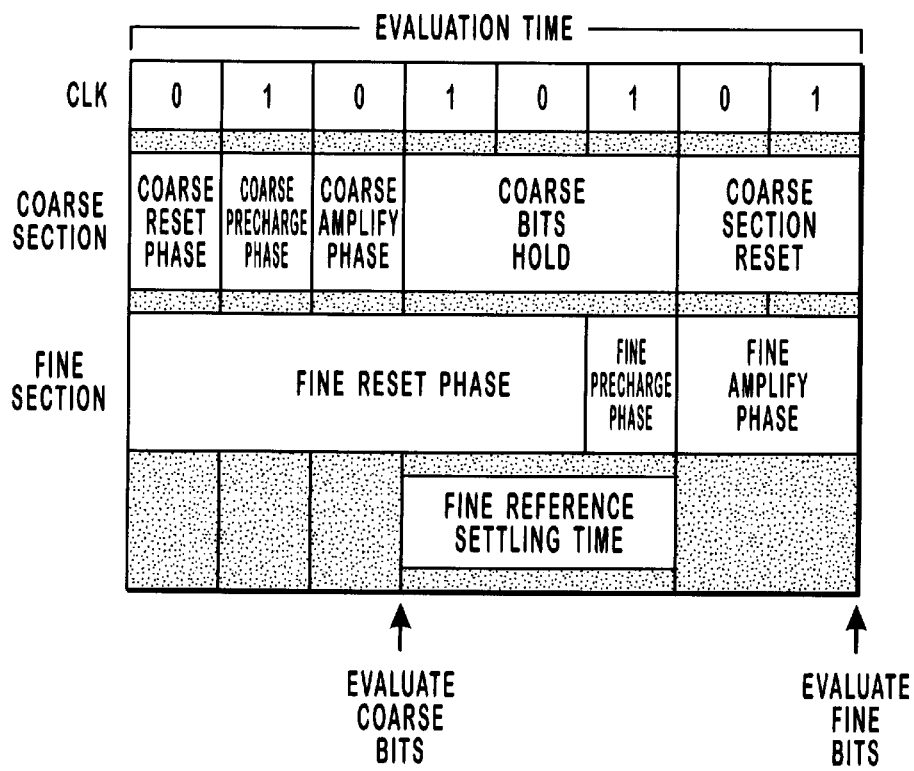
FIG. 18 is a chart illustrating an example of a timing diagram for allowing fine reference values to settle.
Figure 19:
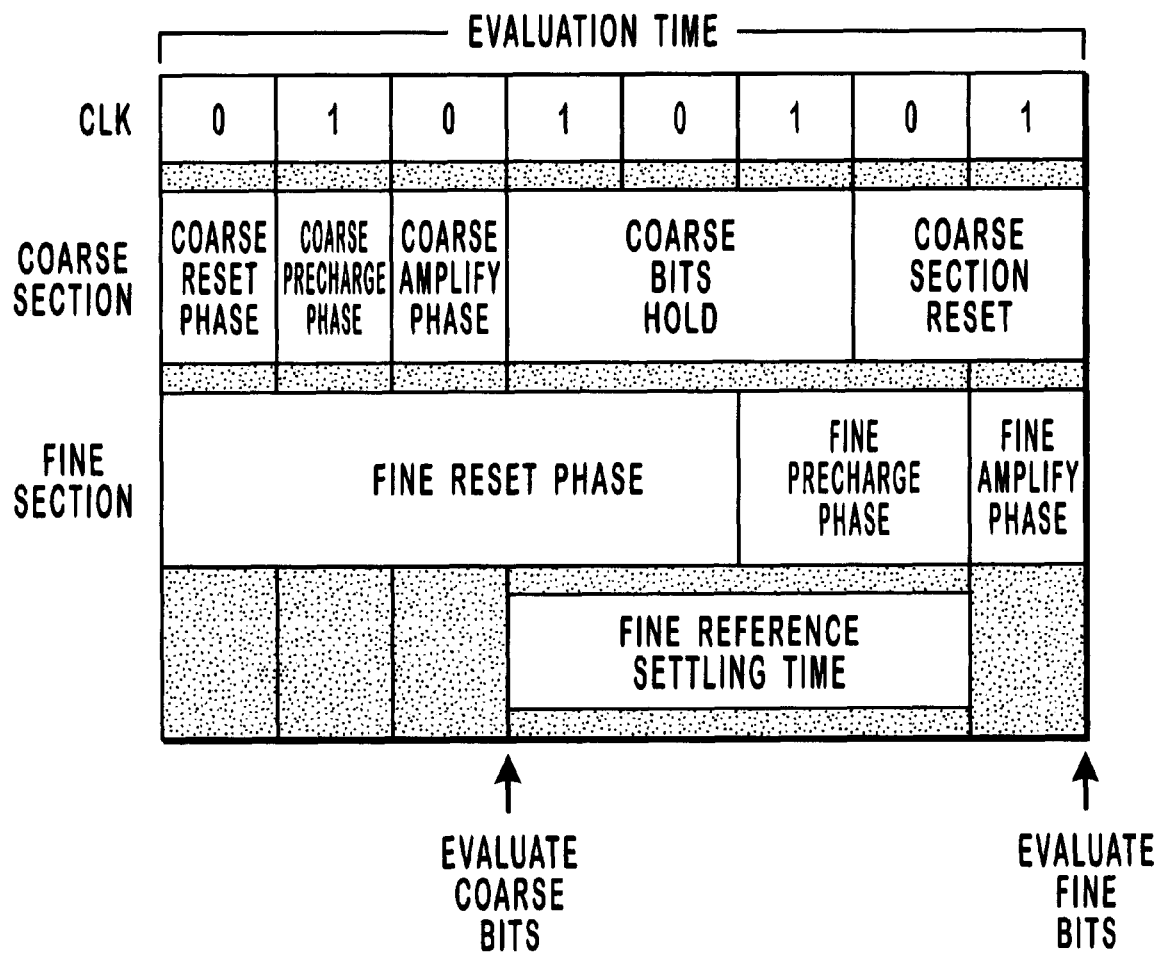
FIG. 19 is a chart illustrating an example of a timing diagram for allowing fine reference values to settle.

To reduce dynamic errors in a subranging converter, it is desirable to allow more time for the fine reference voltages to approach their final potentials. FIGS. 17, 18, and 19 are charts illustrating examples of timing diagrams for allowing fine reference voltage values to settle in a CTA-based subranging ADC.

The third inventive concept of timing schemes for CTAs that, when utilized, may increase the operational frequency of an ADC will now be described. FIGS. 17, 18, and 19 each illustrate timing schemes that are optimized to increase the settling time for fine reference voltages and increase accuracy in the fine comparators. Coarse and fine banks of CTAs are clocked differently so as to utilize the advantageous properties of CTAs In FIG. 17, it is shown that the CTA amplify phase of the coarse section amplifiers and fine section amplifiers is shortened to one clock partition (about one-half of a clock cycle). Amplifying for one clock partition is an advancement in the art as conventional timing schemes recommend at least two clock partitions for amplification and thus take more time to amplify. The timing scheme capitalizes on unique qualities of charger transfer amplifiers, namely that the amplifiers in the coarse section do not suffer from extremely degraded performance through large offset voltages when the length of time for the amplify phase is reduced. In FIG. 17, four clock partitions are allowed for settling of the fine reference voltages. The increased settling time of four clock partitions may potentially double (compared to the two clock partitions used in conventional timing schemes) the operational frequency of an ADC employing the timing scheme of FIG. 17.

In FIG. 18, it is shown that the CTA amplify phase of the coarse section amplifiers is shortened to one clock partition and while the amplify phase of the fine section amplifiers is two clock partitions. In FIG. 18, three clock partitions are allowed for settling of the fine reference voltages. This increased settling time of three clock partitions may potentially increase the operational frequency of an ADC employing the timing scheme of FIG. 18 by 50%. Further, since CTAs in the fine section are allowed two clock partitions for amplification FIG. 18, the CTAs can provide more gain.

In FIG. 19, it is shown that the CTA amplify phase of the coarse section amplifiers and fine section amplifiers are both shortened to one clock partition. In FIG. 19, four clock partitions are allowed for settling of the fine reference voltages. This increased settling time of three clock partitions may potentially double the operational frequency of an ADC employing the timing scheme of FIG. 19. Further, since CTAs in the fine section are allowed two clock partitions for precharging in FIG. 19, analog to digital conversion may be more accurate. This is because CTAs posses offset canceling circuitry that is more effective as more time is allotted for precharging.

Figure 20:
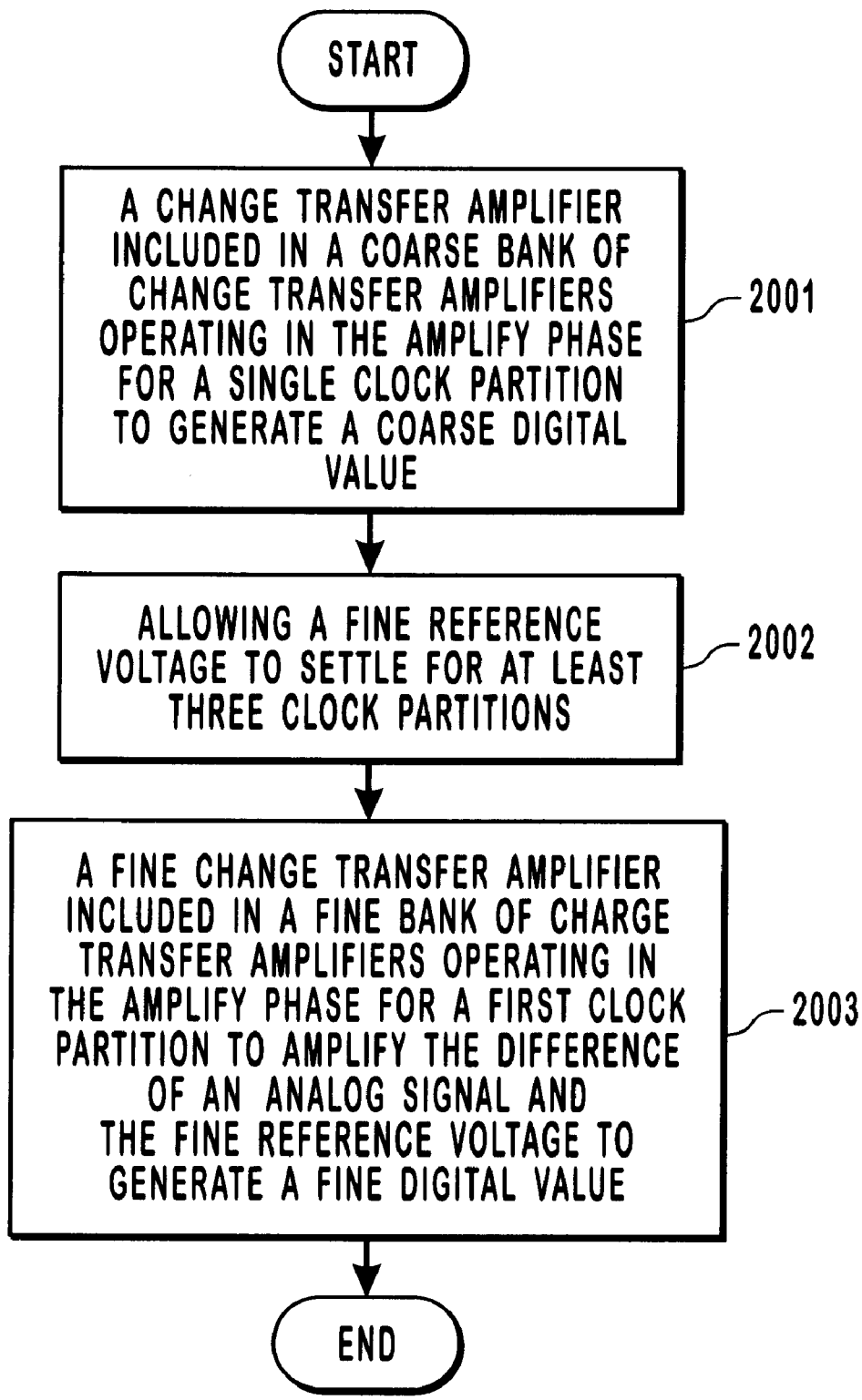
FIG. 20 is a flow diagram illustrating an example of a method for allowing a fine reference values to settle.

FIG. 20 is a flow diagram illustrating an example of a method for allowing a fine reference values to settle. The method in FIG. 20 includes an act of a CTA included in a coarse bank of CTAs operating in the amplify phase for a single clock partition to generate coarse digital values (act 2001). This can include a CTA included in coarse bank of CTAs 2501 operating in the amplify phase for a single clock partition. The method in FIG. 20 also includes an act of allowing a fine reference voltage to settle for at least three clock partitions (act 2002). This can include CTAs included in coarse bank of CTAs 2505 operating for an extended period of time in the reset phase before the precharge and amplify phases are performed. The method in FIG. 20 also includes an act of a CTA included in a fine bank of CTAs operating in the amplify phase for a first clock partition to amplify the difference of an analog signal and the fine reference voltage to generate a fine digital value (act 2003). This can include a CTA included in fine bank of CTAs 2505 operating in the amplify phase for a first clock partition to amplify the difference of analog input 2507 and a fine reference voltage received from fine reference analog mux 2504. If fine bank of CTAs is so configured, a CTA included in fine bank of CTAs 2505 may also operate in the amplify phase for a second clock partition.

Figure 21:
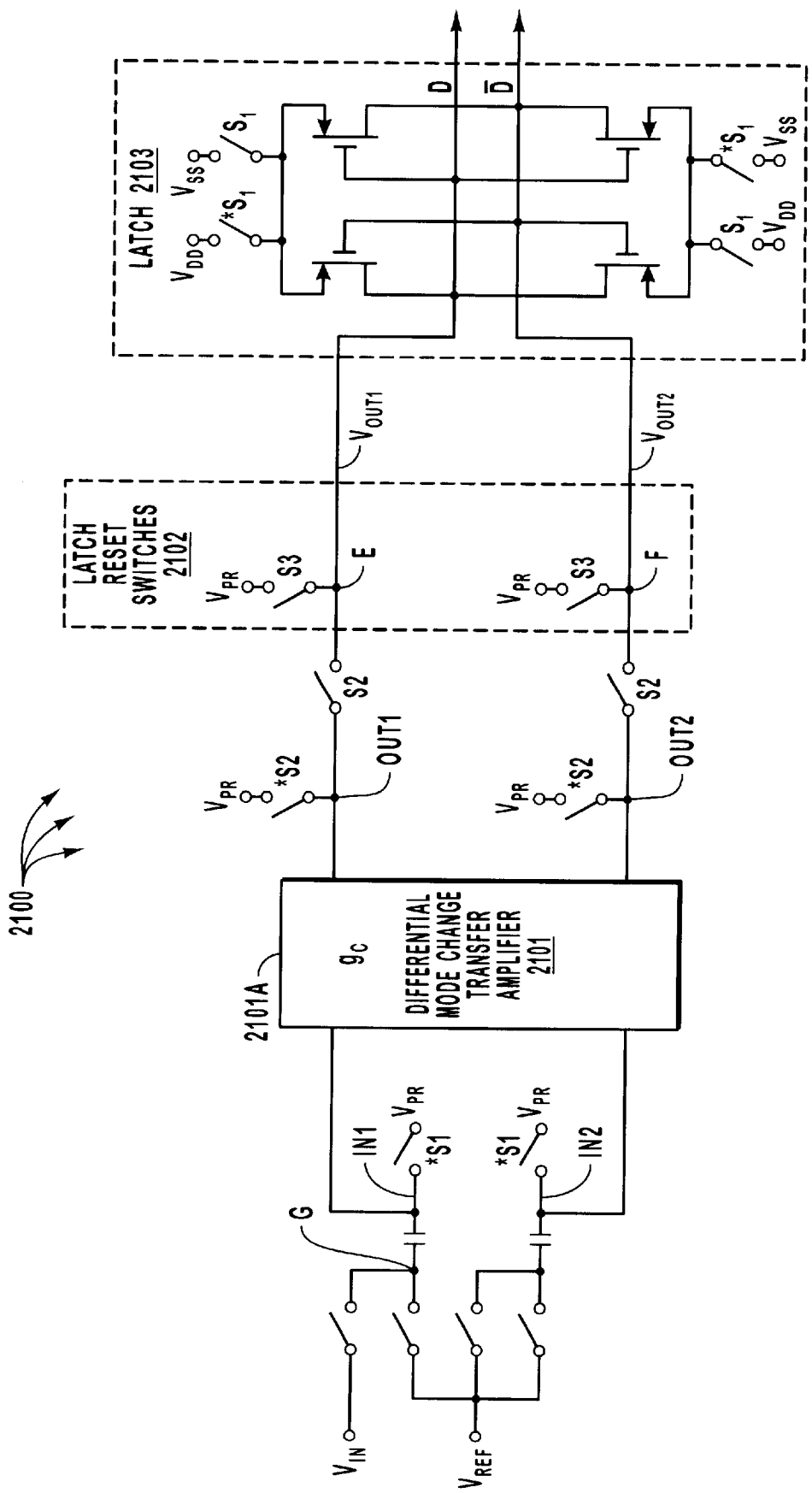
FIG. 21 is a circuit diagram of a comparator in accordance with the present invention.

In ADCs that operate at higher speeds, residual charge imbalances can accumulate on the latch input terminals of a comparator. These charge imbalances can cause errors in the conversion process. As such, the fourth inventive concept includes comparators that significantly reduce residual charge imbalances at the input terminals of a latch. FIG. 21 illustrates a comparator 2100 in accordance with the present invention. The comparator 2100 includes differential mode CTA 2101, latch reset switches 2102, and latch 2103. Latch reset switches 2103 represent a significant advancement in the art and represent an example of a means for substantially reducing stored offset voltages in the form of residual charge imbalances that may accumulate at output terminals OUT1 and OUT2. The means for reducing stored offset voltages reduces stored offset voltages while still allowing latch 2103 to appropriately sample values $V_{OUT1}$ and $V_{OUT2}$. In particular, the switches S3 selectively couple nodes E and F to the precharge voltage $V_{PR}$ during the precharge phase of differential mode CTA 2101. This selective coupling allows latch 2103 to recover, or "zero out" charge imbalances, which may occur as a result of the latch decision process, during the precharge phase. Through the use of a novel timing scheme, latch 2103 remains isolated from differential mode CTA 2101 when zeroing out occurs.

Figure 22:
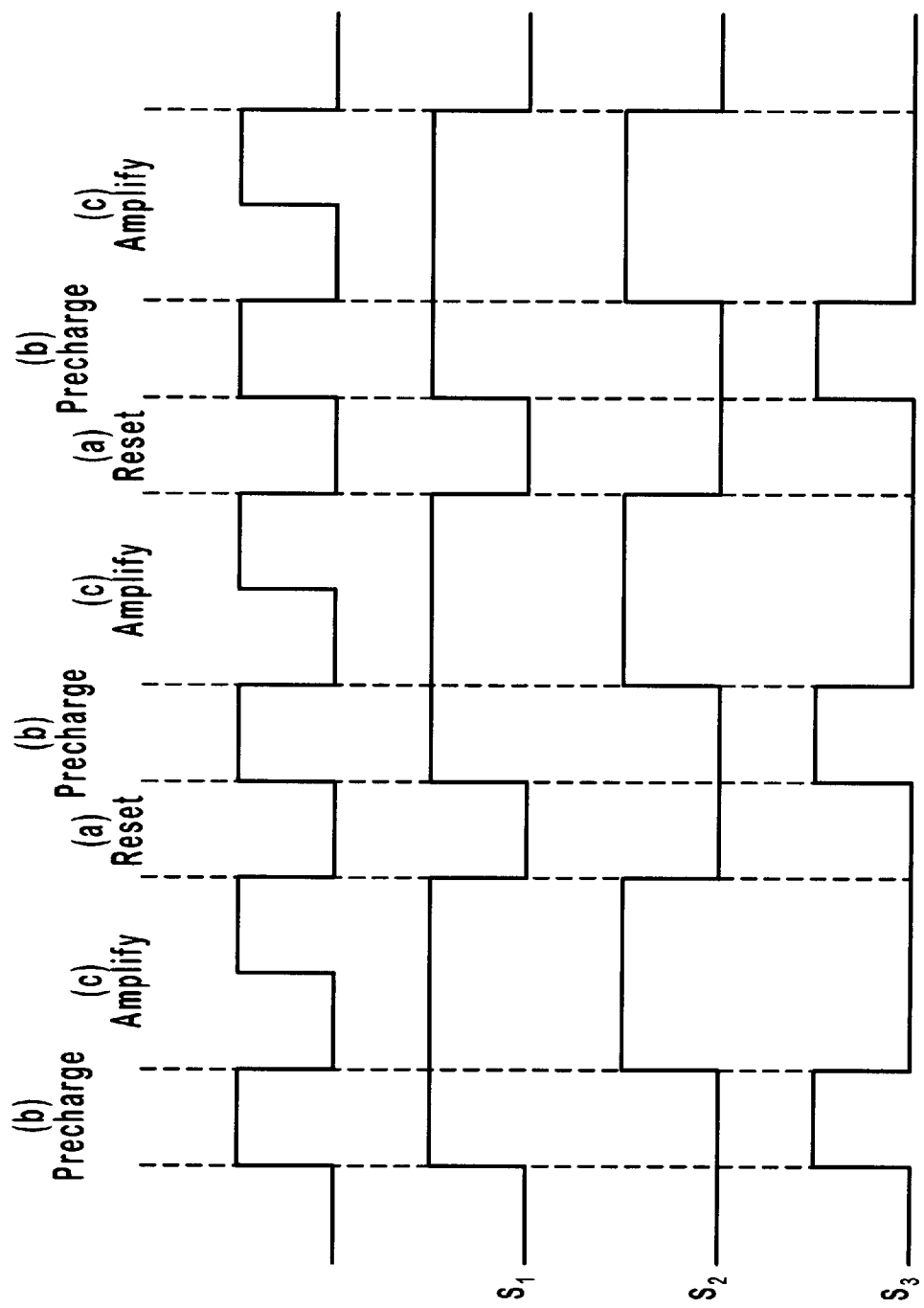
FIG. 22 is a timing diagram of several waveforms used to control switches S1, S2, and S3 in order to properly operate a comparator of FIG. 21.

The differential mode CTA 2101 operates in an amplification cycle that includes three phases: the reset phase, the precharge phase, and the amplify phase. Each phase is implemented by the manipulation of one or more switches S1, *S1, S2, *S2, and S3 illustrated in FIG. 21. FIG. 22 illustrates several timing signals $S_1$, $S_2$, and $S_3$ used to operate corresponding switches S1, *S1, S2, *S2, and S3 in order to implement the phases of differential mode CTA 2101.

A high input signal $S_1$, $S_2$, and $S_3$ indicates that the corresponding switch S1, S2, or S3 is closed, and a low input signal $S_1$, $S_2$, and $S_3$ indicates that the corresponding switch S1, S2, or S3 is open. On the other hand, a high input signal $S_1$, $S_2$, and $S_3$ indicates that the corresponding switch *S1 or *S2 is open, and a low input signal $S_1$, $S_2$, and $S_3$ indicates that the corresponding switch *S1 or *S2 is closed. Switches labeled with an asterisk operate essentially in the inverse to switches that are not labeled with an asterisk. For example, a switch S1 will always be in the opposite state (whether that be open or closed) of a switch *S1.

In the reset phase, differential CTA 2101 is reset. Specifically, the switches of FIG. 21 have the configuration defined in Table 5.

TABLE 5

| Switch | Status |
| --- | --- |
| S1 | Open |
| *S1 | Closed |
| S2 | Open |
| *S2 | Closed |
| S3 | Open |

With these settings the input terminals IN1 and IN2 are coupled to the precharge voltage $V_{PR}$. During the reset phase, *S2 is closed causing the precharge voltage $V_{PR}$ to be asserted at nodes OUT1 and OUT2. Further, as both S2 and S3 are open, node E is isolated from voltages asserted at OUT1 and precharge voltage $V_{PR}$ respectively. Likewise, node F is isolated from voltages asserted at OUT2 and precharge voltage $V_{PR}$ respectively.

In the precharge phase, differential mode CTA 2101 is precharged. Also, nodes E and F are set equal in potential to the precharge voltage $V_{PR}$. This produces a new and surprising effect of reducing charge imbalances at nodes E and F without impacting the operation of differential mode CTA 2101. Specifically, the switches in FIG. 21 have the configuration defined in Table 6.

TABLE 6

| Switch | Status |
| --- | --- |
| S1 | Closed |
| *S1 | Open |
| S2 | Open |
| *S2 | Closed |
| S3 | Closed |

During the precharge phase *S2 remains closed and thus, the precharge voltage $V_{PR}$ continues to be asserted at nodes OUT1 and OUT2. Switch S3 is closed causing the precharge voltage $V_{PR}$ to be asserted at nodes E and F. Assertion of precharge voltage $V_{PR}$ substantially reduces charge imbalances that may remain at nodes E and F from a previous amplify phase of differential mode CTA 2101. However, as switch S2 is open, the precharge voltages at nodes E and F are isolated from the precharge voltage at nodes OUT1 and OUT2 respectively and from differential mode CTA 2101 in general. This allows the latch 2103 to reduce charge imbalances without affecting the precharge function of differential mode CTA 2101.

In the amplify phase, differential mode CTA 2101 is used to perform amplification. Specifically, the switches in FIG. 21 have the configuration defined in Table 7.

TABLE 7

| Switch | Status |
| --- | --- |
| S1 | Closed |
| *S1 | Open |
| S2 | Closed |
| *S2 | Open |
| S3 | Open |

Due to the properties of transconveyance amplifiers, the power dissipation of ADC's utilizing transconveyance amplifiers may be significantly reduced. Further, CTAs may be utilized to create ADCs that provide accurate digital representations of analog signals yet have a reduced number of components, thus providing a further reduction in power dissipation. Through novel timing schemes, the operational frequency and fine reference voltage settling time of subranging ADCs utilizing CTAs may be increased.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An analog-to-digital converter for producing a digital representation of an analog signal, the analog-to-digital converter comprising the following:

a first transconveyance amplifier having an first input terminal and a first output terminal, the first input terminal being coupled to a first input signal source;

a second transconveyance amplifier having an first input terminal and a first output terminal, the first input terminal being coupled to a second input signal source;

a decision circuit having a first input terminal and an output terminal and configured to convert an analog signal appearing on the first input terminal of the decision circuit to a digital value that is asserted at the output terminal of the decision circuit;

a first intermediate capacitor having a first terminal and a second terminal, the first terminal being coupled to the first output terminal of the first transconveyance amplifier; and a second intermediate capacitor having a first terminal and a second terminal, the first terminal being coupled to the second terminal of the first intermediate capacitor and coupled to the first input terminal of the decision circuit, and the second terminal being coupled to the first output terminal of the second transconveyance amplifier.

2. The analog-to-digital converter as recited in claim 1, further comprising:

the first transconveyance amplifier having a second input terminal and a second output terminal, the second input terminal being coupled to the analog signal; the second transconveyance amplifier having a second input terminal and a second output terminal, the second input terminal being coupled to the analog signal;

the decision circuit having a second input terminal;

a third intermediate capacitor having a first terminal and a second terminal, the first terminal being coupled to the second output terminal of the first transconveyance amplifier; and a fourth intermediate capacitor having a first terminal and a second terminal, the first terminal being coupled to the second terminal of the third intermediate capacitor and coupled to the second input terminal of the decision circuit, and the second terminal being coupled to the second output terminal of the second transconveyance amplifier.

3. The analog-to-digital converter as recited in claim 2, wherein the first transconveyance amplifier is implemented as a first charge transfer amplifier configured to operate in an amplifier cycle having a reset phase, a precharge phase, and an amplify phase and the second transconveyance amplifier is implemented as a second charge transfer amplifier configured to operate in an amplifier cycle having a reset phase, a precharge phase, and an amplify phase.

4. The analog-to-digital converter as recited in claim 3, wherein the first charge transfer amplifier is a differential mode charge transfer amplifier and the second charge transfer amplifier is a differential mode charge transfer amplifier.

5. The analog-to-digital converter as recited in claim 2, further comprising:
a third transconveyance amplifier having first and second input terminals and first and second output terminals, the first input terminal being coupled to a third input signal, the second input terminal being coupled to the analog signal, the first output terminal being coupled to the first input terminal of the decision circuit, coupled to the second terminal of the first intermediate capacitor, and coupled to the first terminal of the second intermediate capacitor, and the second output terminal being coupled to the second input terminal of the decision circuit, coupled to the second terminal of the third intermediate capacitor, and coupled to the first terminal of the fourth intermediate capacitor.

6. The analog-to-digital converter as recited in claim 1, wherein the first transconveyance amplifier is implemented as a first charge transfer amplifier configured to operate in an amplifier cycle having a reset phase, a precharge phase, and an amplify phase and the second transconveyance amplifier is implemented as a second charge transfer amplifier configured to operate in an amplifier cycle having a reset phase, a precharge phase, and an amplify phase.

7. The analog-to-digital converter as recited in claim 6, wherein the first charge transfer amplifier is a single-ended charge transfer amplifier and the second charge transfer amplifier is a single-ended charge transfer amplifier.

8. The analog-to-digital converter as recited in claim 1, further comprising:
a third transconveyance amplifier having a an input terminal and an output terminal, the input terminal being coupled to a third input signal source, the output terminal being coupled to the first input terminal of the decision circuit, coupled to the second terminal of the first intermediate capacitor, and coupled to the first terminal of the second intermediate capacitor.

9. An analog-to-digital converter for producing a digital representation of an analog signal, the analog-to-digital converter comprising the following:
a first transconveyance amplifier having a first input terminal and first and second output terminals, the first input terminal being coupled to a first input signal source;
a second transconveyance amplifier having a first input terminal and first and second output terminals, the first input terminal being coupled to a second input signal source;
a first intermediate capacitor having a first terminal and a second terminal, the first terminal being coupled to the first output terminal of the first transconveyance amplifier and the second terminal being coupled to the second output terminal of the second transconveyance amplifier; and
a second intermediate capacitor having a first terminal and a second terminal, the first terminal being coupled to the second output terminal of the first transconveyance amplifier and the first output terminal of the second transconveyance amplifier.

10. The analog-to-digital converter as recited in claim 9, wherein the first transconveyance amplifier is implemented as a first charge transfer amplifier configured to operate in an amplifier cycle having a reset phase, a precharge phase, and an amplify phase and the second transconveyance amplifier is implemented as a second charge transfer amplifier configured to operate in an amplifier cycle having a reset phase, a precharge phase, and an amplify phase.

11. The analog-to-digital converter as recited in claim 10, wherein the first charge transfer amplifier is a differential mode charge transfer amplifier and the second charge transfer amplifier is a differential mode charge transfer amplifier.

12. The analog-to-digital converter as recited in claim 9, further comprising:
the first transconveyance amplifier having a second input terminal, the second input terminal being coupled to the analog signal;
the second transconveyance amplifier having a second input terminal, the second input terminal being coupled to the analog signal;
a third transconveyance amplifier having a first and second input terminals and first and second output terminals, the first input terminal being coupled to a third input signal source and the second input terminal being coupled to the analog signal;
a third intermediate capacitor having a first terminal and a second terminal, the first terminal being coupled to the first output terminal of the second transconveyance amplifier and coupled to the second terminal of the second intermediate capacitor and the second terminal being coupled to the first output terminal of the third transconveyance amplifier; and
a fourth intermediate capacitor having a first terminal and a second terminal, the first terminal being coupled to the second output terminal of the second transconveyance amplifier and coupled to the second terminal of the first intermediate capacitor and the second terminal being coupled to the second output terminal of the third transconveyance amplifier and coupled to the second terminal of the first intermediate capacitor.

13. An analog-to-digital converter for producing a digital representation of an analog signal, the analog-to-digital converter comprising the following:
a first transconveyance amplifier having first and second input terminals and first and second output terminals, the first input terminal being coupled to a first input signal source and the second input terminal being coupled to the analog signal;
a second transconveyance amplifier having first and second input terminals and first and second output terminals, the first input terminal being coupled to the analog signal and the second input terminal being coupled a second signal source;
a third transconveyance amplifier having first and second input terminals and first and second output terminals, the first input terminal being coupled to the analog signal and the second input terminal being coupled to the first input signal source;
a fourth transconveyance amplifier having first and second input terminals and first and second output terminals, the first input terminal being coupled to the second signal source and the second input terminal being coupled to the analog signal.

14. The analog-to-digital converter as recited in claim 13, wherein the first, second, third and fourth transconveyance amplifiers are implemented as charge transfer amplifiers configured to operate in an amplifier cycle having a reset phase, a precharge phase, and an amplify phase.

15. The analog-to-digital converter as recited in claim 14, wherein the first, second, third, and fourth transconveyance amplifiers are differential mode charge transfer amplifiers.

16. The analog-to-digital converter as recited in claim 13, further comprising:
a first weak averaging capacitor having a first terminal and a second terminal, the first terminal being coupled to the first output terminal of the first transconveyance amplifier and the second terminal being coupled to the first terminal of the second transconveyance amplifier;
a second weak averaging capacitor having a first terminal and a second terminal, the first terminal being coupled to the second output terminal of the first transconveyance amplifier and the second terminal being coupled to the second terminal of the second transconveyance amplifier;
a third weak averaging capacitor having a first terminal and a second terminal, the first terminal being coupled to the first output terminal of the third transconveyance amplifier and the second terminal being coupled to the second output terminal of the fourth transconveyance amplifier; and
a fourth weak averaging capacitor having a first terminal and a second terminal, the first terminal being coupled to the second output terminal of the first transconveyance amplifier and the second terminal being coupled to the first output terminal of the fourth transconveyance amplifier.

17. The analog-to-digital converter as recited in claim 16, further comprising:
a decision circuit having first and second input terminals and an output terminal and configured to convert an analog signal appearing on the first input terminal of the decision circuit to a digital value that is asserted at the output terminal of the decision circuit;
a first intermediate capacitor having a first terminal and a second terminal, the first terminal being coupled to the first output terminal of the second transconveyance amplifier and coupled to the second terminal of the first weak averaging capacitor;
a second intermediate capacitor having a first terminal and a second terminal, the first terminal being coupled to the second output terminal of the second transconveyance amplifier and coupled to the second terminal of the second weak averaging capacitor;
a third intermediate capacitor having a first terminal and a second terminal, the first terminal being coupled to the second terminal of the first intermediate capacitor and coupled to the first input terminal of the decision circuit and the second terminal being coupled to the first output terminal of the third transconveyance amplifier and coupled to the first terminal of the third weak averaging capacitor; and
a fourth intermediate capacitor having a first terminal and a second terminal, the first terminal being coupled to the second terminal of the second intermediate capacitor and coupled to second input terminal of the decision circuit and the second terminal being coupled to the second output terminal of the third transconveyance amplifier and coupled to the first terminal of the fourth weak averaging capacitor.

18. The analog-to-digital converter as recited in claim 17, further comprising:
a fifth transconveyance amplifier having first and second input terminals and first and second output terminals, the first input terminal being coupled to the analog signal and the second input terminal being coupled to a third input signal source, the first output terminal being coupled to the second terminal of the first intermediate capacitor, coupled to the first input terminal of the decision circuit, and coupled to the first terminal of the third intermediate capacitor, the second output terminal being coupled to the second terminal of the second intermediate capacitor, coupled to the second input terminal of the decision circuit, and coupled to the first terminal of the fourth intermediate capacitor.

19. A method for generating a digital value in an analog-to-digital converter that includes a sequential array of transconveyance amplifiers each having at least an input terminal and an output terminal, the method comprising the following:
an act of generating a first output signal at an output terminal of a first transconveyance amplifier by amplifying a difference between an input signal and a first reference signal;
an act of generating a second output signal at an output terminal of a second transconveyance amplifier by amplifying the difference between an input signal and a second reference signal;
an act of a decision circuit detecting the voltage on an input terminal that is capacitively coupled to the output terminal of the first transconveyance amplifier and capacitively coupled to the output terminal of the second transconveyance amplifier; and
an act of the decision circuit generating the digital value based on the detected voltage.

20. The method as recited in claim 19, wherein the act of generating a first output signal at an output terminal of a first transconveyance amplifier by amplifying a difference between an input signal and a first reference signal comprises the following:
an act of generating a first output signal at an output terminal of a charge transfer amplifier by amplifying a difference between an input signal and a first reference signal.

21. The method as recited in claim 20, wherein generating a first output signal at an output terminal of a charge transfer amplifier by amplifying a difference between an input signal and a first reference signal the comprises the following:
an act of generating a first output signal at an output terminal of a charge transfer amplifier when the charge transfer amplify operates in an amplify phase.

22. The method as recited in claim 20, wherein the act of generating a first output signal at an output terminal of a charge transfer amplifier by amplifying a difference between an input signal and a first reference signal comprises the following:
an act of generating a first output signal at an output terminal of a differential mode charge transfer amplifier by amplifying a difference between an input signal and a first reference signal.

23. The method as recited in claim 20, wherein the act of generating a first output signal at an output terminal of a charge transfer amplifier by amplifying a difference between an input signal and a first reference signal comprises the following:
an act of generating a first output signal at an output terminal of a single-end charge transfer amplifier by amplifying a difference between an input signal and a first reference signal.

24. The method as recited in claim 19, wherein the act of a decision circuit detecting the voltage on an input terminal that is capacitively coupled to the output terminal of the first transconveyance amplifier and capacitively coupled to the output terminal of the second transconveyance amplifier comprises the following:

an act of detecting a voltage on an output terminal of a third transconveyance amplifier, the output terminal of the third transconveyance amplifier being coupled to the input terminal of the decision circuit.

25. The method as recited in claim 19, further comprising an act of generating a third output signal at the output terminal of a third transconveyance amplifier by amplifying a difference between an input signal and a third reference signal.

26. A sampling circuit for use in an analog-to-digital converter for producing a digital representation of an analog electrical signal, the sampling circuit comprising the following:

a first switch having a first terminal and a second terminal, the first terminal being coupled to an analog input signal;

a second switch having a first terminal and a second terminal, the first terminal being coupled to a reference voltage;

a first capacitor having a first terminal and a second terminal, the first terminal being coupled to the second terminal of the first switch;

a second capacitor having a first terminal and a second terminal, the first terminal being coupled to the second terminal of the third switch; and a third switch having a first terminal and a second terminal, the first terminal being coupled to the second terminal of the first switch and coupled to the first terminal of the first capacitor and the second terminal being coupled to the first terminal of the second switch and coupled to the first terminal of the second capacitor.

27. The sampling circuit as recited in claim 26, further comprising:

a transconveyance amplifier with a first input terminal and a second input terminal, the first input terminal being coupled to the second terminal of the first capacitor and the second input terminal being coupled to the second terminal of the second capacitor.

28. The sampling circuit as recited in claim 27, wherein the transconveyance amplifier is implemented as a charge transfer amplifier configured to operate in an amplifier cycle having a reset phase, a precharge phase, and an amplify phase.

29. The analog-to-digital converter as recited in claim 28, wherein the charge transfer amplifier is a differential mode charge transfer amplifier.

30. The analog-to-digital converter as recited in claim 28, wherein the charge transfer amplifier is a single-ended charge transfer amplifier.

31. The sampling circuit as recited in claim 27, further comprising:

a fourth switch having a first terminal and a second terminal, the first terminal being coupled to a precharge voltage and the second terminal being coupled to the second terminal of the first capacitor and coupled to the first input terminal of the transconveyance amplifier; and a fifth switch having a first terminal and a second terminal, the first terminal being coupled to a precharge voltage and the second terminal being coupled to the second terminal of the second capacitor and coupled to the second input terminal of the transconveyance amplifier.

32. A method for sampling analog input signals that appear on an input terminal of an analog-to-digital converter, the analog-to-digital converter having a coarse bank of charge transfer amplifiers, each charge transfer amplifier in the coarse bank having the input terminal of the analog-to-digital converter as a first coarse input terminal and a second coarse input terminal coupled to a coarse reference voltage source, each charge transfer amplifier in the coarse bank configured to operate in an amplifier cycle having a reset phase, a precharge phase, and an amplify phase, the coarse bank of charge transfer amplifiers configured to convert an analog input signal into a plurality of coarse digital values, the analog-to-digital converter also having a fine bank of charge transfer amplifiers, each charge transfer amplifier in the fine bank having the input terminal of the analog-to-digital converter as a first fine input terminal and a second fine input terminal coupled to a fine reference voltage source, each charge transfer amplifier in the fine bank being coupled to one or more input capacitors and each being configured to operate in an amplifier cycle having a reset phase, a precharge phase, and an amplify phase, the fine bank of charge transfer amplifiers being configured to subrange into the plurality of coarse digital values and convert the analog input signal into one or more fine digital values that are subsequently combined with the coarse digital values, the method comprising the following:

an act of sampling an analog input signal at the first coarse input terminals;

an act of sampling the analog input signal at the first fine input terminals essentially simultaneously to sampling the analog input signal at the first coarse input terminals;

an act of holding the analog input signal in the one or more input capacitors coupled to each charge transfer amplifier in the fine bank until a fine reference signal determined by the coarse bank settles for a predetermined time;

an act of sampling the fine reference signal applied at a second fine input terminal; and an act of providing the difference of the analog input signal and the fine reference signal at an output terminal of a charge transfer amplifier in the fine bank of charge transfer amplifiers.

33. The method as recited in claim 32, wherein the act of holding the analog input signal in the one or more input capacitors coupled to each charge transfer amplifier in the fine bank until a fine reference signal determined by the coarse bank settles for a predetermined time comprises the following:

an act of holding the analog signal while the fine bank is in the reset phase.

34. The method as recited in claim 33, wherein the act of holding the analog input signal in the one or more input capacitors coupled to each charge transfer amplifier in the fine bank until a fine reference signal determined by the coarse bank settles for a predetermined time comprises the following:

an act of holding the analog signal while the fine bank is in the precharge phase.

35. The method as recited in claim 32, wherein the act of providing the difference of the analog input signal and the fine reference signal at an output terminal of a charge transfer amplifier in the fine bank of charge transfer amplifiers comprises the following:

act of providing the difference of the analog input signal and the fine reference signal during the amplify phase of the fine bank.

36. The method as recited in claim 32, further comprising:

an act of sampling one of a plurality of incrementally differing coarse reference signals at each second coarse input terminal where one of the plurality of incrementally differing coarse reference signals appears.

37. A method for reducing the time for an analog-to-digital converter having an input terminal to produce a digital representation of an analog electrical signal, the analog-to-digital converter having a coarse bank of charge transfer amplifiers, each charge transfer amplifier in the coarse bank having the input terminal of the analog-to-digital converter as a first coarse input terminal and a second coarse input terminal coupled to a coarse reference voltage source and each configured to operate in an amplifier cycle having a reset phase, a precharge phase, and an amplify phase, the coarse bank of charge transfer amplifiers configured to convert an analog input signal into a plurality of coarse digital values, the analog-to-digital converter also having a fine bank of charge transfer amplifiers, each charge transfer amplifier in the fine bank having the input terminal of the analog-to-digital converter as a first fine input terminal and a second fine input terminal coupled to a fine reference voltage source, each charge transfer amplifier in the fine bank being coupled to one or more input capacitors and each configured to operate in an amplifier cycle having a reset phase, a precharge phase, and an amplify phase, the fine bank of charge transfer amplifiers configured to subrange into the plurality of coarse digital values and convert the analog input signal into one or more fine digital values that are subsequently combined with the coarse digital values, the analog-to-digital converter having a clock that generates clock partitions, the method comprising the following:

an act of a charge transfer amplifier included in the coarse bank of charge transfer amplifiers operating in the amplify phase for a single clock partition to generate a coarse digital value by amplifying the difference in an analog input signal and a coarse reference signal;

an act of allowing a fine reference voltage to settle for at least three clock partitions; and an act of a charge transfer amplifier included in the fine bank of charge transfer amplifiers operating in the amplify phase for a first clock partition to amplify the difference in an analog signal and the fine reference voltage to generate a fine digital value.

38. The method as recited in claim 37, wherein the act of allowing a fine reference voltage to settle for at least three clock partitions comprises the following:

an act of allowing the fine reference voltage to settle for three clock partitions.

39. The method as recited in claim 37, wherein the act of allowing a fine reference voltage to settle for at least three clock partitions comprises the following:

an act of allowing the fine reference voltage to settle for four clock partitions.

40. The method as recited in claim 37, further comprising:

an act of the charge transfer amplifier included in the fine bank of charge transfer amplifiers operating in the amplify phase for a second clock partition to amplify the difference in an analog signal and the fine reference voltage to generate a fine digital value.

41. A comparator for producing a digital value on a digital output terminal that is related to the magnitude of a differential input voltage applied between first and second input terminals of the comparator, the comparator comprising the following:

a transconveyance amplifier having the first input terminal as first amplifier input terminal, having the second input terminal as a second amplifier input terminal, having a first amplifier output terminal, and having a second amplifier output terminal;

a latch with a first latch input terminal, a second latch input terminal, and the digital output terminal as a latch output terminal;

a first switch having a first terminal coupled to the first amplifier output terminal and having a second terminal coupled to the first latch input terminal, first switch electrically coupling the first amplifier output terminal to the first latch input terminal during the amplify phase of the charge transfer amplifier;

a second switch having a first terminal coupled to the second amplifier output terminal and having a second terminal coupled to the second latch input terminal, the second switch electrically coupling the second amplifier output terminal to the second latch input terminal during the amplify phase of the charge transfer amplifier;

a third switch having a first terminal coupled to an equalization voltage source and having a second terminal coupled to the first latch input terminal, the third switch electrically coupling the equalization voltage source to the first latch input terminal during the precharge phase of the charge transfer amplifier; and a fourth switch having a first terminal coupled to the equalization voltage source and having a second terminal coupled to the second latch input terminal, the fourth switch electrically coupling the equalization voltage source to the second latch input terminal during the precharge phase of the charge transfer amplifier.

42. The sampling circuit as recited in claim 41, wherein the transconveyance amplifier is implemented as a charge transfer amplifier configured to operate in an amplifier cycle having a reset phase, a precharge phase, and an amplify phase.

43. The analog-to-digital converter as recited in claim 42, wherein the charge transfer amplifier is a differential mode charge transfer amplifier.

44. The analog-to-digital converter as recited in claim 42, wherein the charge transfer amplifier is a single-ended charge transfer amplifier.

* * * * *

UNITED STATES PATENT AND TRADEMARK OFFICE
CERTIFICATE OF CORRECTION

PATENT NO. : 6,606,049 B1
DATED : August 12, 2003
INVENTOR(S) : William J. Marble It is certified that error appears in the above-identified patent and that said Letters Patent is hereby corrected as shown below:

Title page,
Item [56], References Cited, U.S. PATENT DOCUMENTS, change "Jeanpierre" to -- Jean Pierre --; and change "365/205" to -- 340/173 --

Drawings,
Sheet 6, Figure 6, delete "change" and insert -- charge --
Sheet 7, Figure 7, delete "change" and insert -- charge --
Sheet 8, Figure 8, delete "change" and insert -- charge --
Sheet 10, Figure 10, delete "change" and insert -- charge --
Sheet 11, Figure 11, delete "change" and insert -- charge --
Sheet 12, Figure 12, delete "change" and insert -- charge --
Sheet 15, Figure 15, delete "change" and insert -- charge --
Sheet 18, Figure 18, delete "change" and insert -- charge --
Sheet 19, Figure 19, delete "change" and insert -- charge --

Column 4,
Line 26, before "Analog" insert -- " --

Column 9,
Line 35, change "—($\Delta V_{IN}$)" to -- -($\Delta V_{IN}$) --

Column 15,
Line 17, after "CTAs" insert -- . --

Column 19,
Line 34, after "having" delete "a"

Signed and Sealed this

Fourth Day of May, 2004

JON W. DUDAS
*Acting Director of the United States Patent and Trademark Office*